US010991692B2

(12) United States Patent
Kang et al.

(10) Patent No.: US 10,991,692 B2
(45) Date of Patent: Apr. 27, 2021

(54) SEMICONDUCTOR DEVICE HAVING A PLURALITY OF FINS AND METHOD OF FABRICATING THE SAME

(71) Applicant: Samsung Electronics Co., Ltd., Suwon-si (KR)

(72) Inventors: Myoung Ho Kang, Suwon-si (KR); Gyeongseop Kim, Suwon-si (KR); Jeong Lim Kim, Seoul (KR); Jae Myoung Lee, Seoul (KR); Heung Suk Oh, Bucheon-si (KR); Yeon Hwa Lim, Seoul (KR); Joong Won Jeon, Seoul (KR); Sung Min Kim, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/840,764

(22) Filed: Apr. 6, 2020

(65) Prior Publication Data

US 2020/0235097 A1 Jul. 23, 2020

Related U.S. Application Data

(60) Continuation of application No. 16/593,058, filed on Oct. 4, 2019, now Pat. No. 10,643,998, which is a
(Continued)

(30) Foreign Application Priority Data

Apr. 3, 2017 (KR) .................... 10-2017-0043207

(51) Int. Cl.
*H01L 27/088* (2006.01)
*H01L 21/033* (2006.01)
(Continued)

(52) U.S. Cl.
CPC ...... *H01L 27/0886* (2013.01); *H01L 21/0334* (2013.01); *H01L 21/3083* (2013.01);
(Continued)

(58) Field of Classification Search
CPC .................... H01L 27/0886; H01L 21/845
See application file for complete search history.

(56) References Cited

U.S. PATENT DOCUMENTS 7,061,038 B2 * 6/2006 Endoh ............... H01L 27/0207
257/300
8,501,607 B1 * 8/2013 Juengling ......... H01L 29/66795
438/587
(Continued)

FOREIGN PATENT DOCUMENTS

KR 201330115062 10/2013

OTHER PUBLICATIONS

"Semiconductor Device Having First and Second Fin-Type Patterns and Method of Fabricating the Same" Specification, Drawings and Prosecution History of U.S. Appl. No. 15/837,310, filed Dec. 11, 2017, now U.S. Pat. No. 10,475,789, issued Nov. 12, 2019 by Myoung Ho Kang, et al., which is stored in the United States Patent and Trademark Office (USPTO).
(Continued)

*Primary Examiner* — Caleb E Henry
(74) *Attorney, Agent, or Firm* — Onello & Mello, LLP

(57) ABSTRACT

A semiconductor device comprises a first fin-type pattern comprising a first long side extending in a first direction, and a first short side extending in a second direction. A second fin-type pattern is arranged substantially parallel to the first fin-type pattern. A first gate electrode intersects the first fin-type pattern and the second fin-type pattern. The second fin-type pattern comprises a protrusion portion that protrudes beyond the first short side of the first fin-type pattern. The first gate electrode overlaps with an end portion of the first fin-type pattern that comprises the first short side of the first fin-type pattern. At least part of a first sidewall of the first fin-type pattern that defines the first short side of the first fin-type pattern is defined by a first trench having a first
(Continued)

depth. The first trench directly adjoins a second trench having a second, greater, depth.

20 Claims, 38 Drawing Sheets

Related U.S. Application Data division of application No. 15/837,310, filed on Dec. 11, 2017, now Pat. No. 10,475,789.

(51) Int. Cl.

| H01L 21/8234 | (2006.01) |
|---|---|
| H01L 21/308 | (2006.01) |
| H01L 21/84 | (2006.01) |
| H01L 27/12 | (2006.01) |
| H01L 29/06 | (2006.01) |
| H01L 29/417 | (2006.01) |

(52) U.S. Cl.
CPC .... *H01L 21/823431* (2013.01); *H01L 21/845* (2013.01); *H01L 27/1211* (2013.01); *H01L 29/0657* (2013.01); *H01L 29/41791* (2013.01)

(56) References Cited

U.S. PATENT DOCUMENTS

| 8,598,641 | B2 | 12/2013 | Chen et al. |
| 8,637,135 | B2 | 1/2014 | Lee et al. |
| 8,703,557 | B1* | 4/2014 | Cai ................... H01L 29/6681 257/347 |
| 8,772,117 | B2 | 7/2014 | Chi et al. |
| 8,860,148 | B2 | 10/2014 | Hu et al. |
| 8,881,066 | B2 | 11/2014 | Shieh et al. |
| 8,937,353 | B2* | 1/2015 | Chen ................... H01L 27/0924 257/347 |
| 9,035,431 | B2* | 5/2015 | Cheng ................... H01L 21/845 257/618 |
| 9,054,218 | B2* | 6/2015 | Adam ................... H01L 29/167 |
| 9,082,739 | B2 | 7/2015 | Su et al. |
| 9,087,724 | B2* | 7/2015 | Khakifirooz .... H01L 21/823814 |
| 9,117,909 | B2* | 8/2015 | Kuo ................... H01L 21/76224 |
| 9,177,963 | B2 | 11/2015 | Mittal et al. |
| 9,184,169 | B2 | 11/2015 | Kim et al. |
| 9,190,496 | B2 | 11/2015 | Lin et al. |
| 9,219,002 | B2 | 12/2015 | Hu et al. |
| 9,236,267 | B2 | 1/2016 | De et al. |
| 9,275,890 | B2 | 3/2016 | Wei et al. |
| 9,305,918 | B2 | 4/2016 | Hu et al. |
| 9,337,101 | B1* | 5/2016 | Sung ................ H01L 21/823431 |
| 9,355,209 | B2 | 5/2016 | Chuang et al. |
| 9,373,622 | B2 | 6/2016 | Yin et al. |
| 9,397,006 | B1* | 7/2016 | Ok ..................... H01L 27/0886 |
| 9,437,415 | B2 | 9/2016 | Shieh et al. |
| 9,437,496 | B1* | 9/2016 | Chudzik ........... H01L 29/66795 |
| 9,455,198 | B1* | 9/2016 | Yu .................... H01L 21/823481 |
| 9,472,572 | B2* | 10/2016 | Zang ..................... H01L 21/845 |
| 9,496,186 | B1* | 11/2016 | Bedell ................ H01L 29/0649 |
| 9,502,408 | B2* | 11/2016 | Kerber ........... H01L 21/823431 |
| 9,524,908 | B2 | 12/2016 | Qi et al. |
| 9,543,416 | B2 | 1/2017 | Sung et al. |
| 9,559,008 | B2* | 1/2017 | Lin ..................... H01L 27/0886 |
| 9,589,849 | B2 | 3/2017 | Jacob et al. |
| 9,601,628 | B2* | 3/2017 | You ................ H01L 21/823431 |
| 9,613,954 | B2 | 4/2017 | Basker et al. |
| 9,704,973 | B2 | 7/2017 | Xie et al. |
| 9,722,024 | B1* | 8/2017 | Xie ................ H01L 21/823431 |
| 9,859,421 | B1* | 1/2018 | Robison ............. H01L 29/7827 |
| 9,876,077 | B1 | 1/2018 | Xie et al. |
| 10,032,869 | B2* | 7/2018 | Wang .................. H01L 29/0653 |
| 2007/0018239 | A1* | 1/2007 | Chen ................ H01L 29/66795 257/329 |
| 2012/0043597 | A1* | 2/2012 | Chen .............. H01L 21/823412 257/296 |
| 2013/0292777 | A1* | 11/2013 | Liaw ..................... G11C 11/419 257/369 |
| 2014/0001562 | A1* | 1/2014 | Liaw ............... H01L 21/823821 257/369 |
| 2014/0151807 | A1* | 6/2014 | Chi ..................... H01L 27/1211 257/348 |
| 2014/0264631 | A1* | 9/2014 | Wei ................... H01L 21/76224 257/401 |
| 2015/0021710 | A1 | 1/2015 | Hsu et al. |
| 2015/0076610 | A1* | 3/2015 | Ito ........................... H01L 29/16 257/365 |
| 2015/0187867 | A1* | 7/2015 | Basker ............ H01L 21/823431 257/401 |
| 2015/0206954 | A1* | 7/2015 | Lin ................... H01L 29/66795 257/365 |
| 2015/0279959 | A1* | 10/2015 | Qi ................... H01L 21/823431 438/585 |
| 2015/0279971 | A1* | 10/2015 | Xie ................... H01L 29/66818 257/401 |
| 2015/0294976 | A1* | 10/2015 | Kim ..................... H01L 29/6656 438/702 |
| 2015/0311207 | A1* | 10/2015 | Ching ............. H01L 21/823807 257/192 |
| 2015/0325575 | A1* | 11/2015 | Park ..................... H01L 29/0653 257/401 |
| 2016/0013183 | A1* | 1/2016 | Basker ............ H01L 21/823431 257/401 |
| 2016/0020150 | A1* | 1/2016 | You ....................... H01L 29/165 438/218 |
| 2016/0079354 | A1* | 3/2016 | Park ................... H01L 29/66545 257/386 |
| 2016/0086946 | A1* | 3/2016 | Yin ................. H01L 21/823842 257/369 |
| 2016/0133726 | A1* | 5/2016 | Sung ............... H01L 21/823821 438/283 |
| 2016/0155741 | A1 | 6/2016 | Yoo et al. |
| 2016/0190122 | A1 | 6/2016 | Hu et al. |
| 2016/0254195 | A1* | 9/2016 | Jacob ............. H01L 21/823821 438/221 |
| 2017/0221890 | A1* | 8/2017 | Wang ............. H01L 21/823418 |
| 2018/0006111 | A1* | 1/2018 | Xie ................ H01L 21/823431 |

OTHER PUBLICATIONS

"Semiconductor Device Having First and Second Fin-Type Patterns and Method of Fabricating the Same" Specification, Drawings and Prosecution History of U.S. Appl. No. 16/593,058, filed Oct. 4, 2019, by Myoung Ho Kang, et al., which is stored in the United States Patent and Trademark Office (USPTO).

\* cited by examiner

SEMICONDUCTOR DEVICE HAVING A PLURALITY OF FINS AND METHOD OF FABRICATING THE SAME

CROSS-REFERENCE TO RELATED APPLICATION

This application is a continuation application of U.S. Ser. No. 16/593,058, filed on Oct. 4, 2019, which is a divisional application of U.S. patent application Ser. No. 15/837,310, filed on Dec. 11, 2017, now U.S. Pat. No. 10,475,789, issued Nov. 12, 2019, which claims priority from Korean Patent Application No. 10-2017-0043207 filed on Apr. 3, 2017 in the Korean Intellectual Property Office, and all the benefits accruing therefrom under 35 U.S.C. 119, the disclosures of which in their entirety are herein incorporated by reference.

BACKGROUND

1. Technical Field

The present disclosure relates to a semiconductor device and a method of fabricating the same.

2. Description of the Related Art

As a scaling technique for increasing the integration density of a semiconductor device, a multi-gate transistor has been suggested in which a fin-shape silicon body is formed on a substrate while gates are formed on the surface of the silicon body.

The multi-gate transistor uses a three-dimensional (3D) channel allowing for scaling in larger or smaller adaptations. In addition, such configurations allow for enhanced current control of the multi-gate transistor without the need for increasing the gate length of the multi-gate transistor. Further, the short channel effect (SCE), which is a phenomenon in which the electric potential of a channel region is affected by a drain voltage, as known to those of skill in the art, can be effectively suppressed.

SUMMARY

Embodiments of the present disclosure provide a semiconductor device in which a shallow trench is formed at the border between a tapered fin-type pattern and an active region so as to improve operating performance and reliability.

Embodiments of the present disclosure provide a method of fabricating a semiconductor device in which a shallow trench is formed at the border between a tapered fin-type pattern and an active region so as to improve operating performance and reliability.

However, embodiments of the present disclosure are not restricted to those set forth herein. The above and other embodiments of the present disclosure will become more apparent to those of ordinary skill in the art to which the present disclosure pertains by referencing the detailed description of the present disclosure given below.

According to an embodiment of the present disclosure, the semiconductor device includes a first fin-type pattern including a first long side, which extends in a first direction, and a first short side, which extends in a second direction that is different from the first direction, a second fin-type pattern arranged in parallel to the first fin-type pattern and including a second long side, which extends in the first direction and is opposite to the first long side of the first fin-type pattern; and a first gate electrode intersecting the first and second fin-type patterns wherein the second fin-type pattern includes a protrusion portion that protrudes beyond the first short side of the first fin-type pattern in the first direction, the first gate electrode overlaps with an end portion of the first fin-type pattern that includes the first short side of the first fin-type pattern, at least part of a first sidewall of the first fin-type pattern that defines the first short side of the first fin-type pattern is defined by a first trench having a first depth, and the first trench directly adjoins a second trench having a second depth, which is greater than the first depth.

According to the aforementioned and other embodiments of the present disclosure, the semiconductor device includes a first fin-type pattern including a first long side, which extends in a first direction, and a first short side, which extends in a second direction that is different from the first direction, a second fin-type pattern arranged in parallel to the first fin-type pattern and including a second long side, which extends in the first direction and is opposite to the first long side of the first fin-type pattern, and a field insulating film surrounding part of the first fin-type pattern and part of the second fin-type pattern, wherein the second fin-type pattern includes a protrusion portion that protrudes beyond the first short side of the first fin-type pattern in the first direction, a sidewall of the first fin-type pattern that defines the first short side of the first fin-type pattern is defined by a sidewall of a first trench having a first depth, the sidewall of the first trench is connected to a sidewall of a second trench having a second depth, which is greater than the first depth, and a location where the sidewall of the first trench and the sidewall of the second trench are connected is located lower than a top surface of the field insulating film with respect to a top surface of the first fin-type pattern.

According to the aforementioned and other embodiments of the present disclosure, the semiconductor device includes an active region defined by a first trench having a first depth, a first fin-type pattern formed in the active region and including a first long side, which extends in a first direction, and a first short side, which extends in a second direction that is different from the first direction, a second fin-type pattern formed in the active region, arranged in parallel to the first fin-type pattern, and including a second long side, which extends in the first direction and is opposite to the first long side of the first fin-type pattern, a field insulating film surrounding part of the first fin-type pattern and part of the second fin-type pattern; and a gate electrode intersecting the first and second fin-type patterns, wherein the second fin-type pattern includes a protrusion portion that protrudes beyond the first short side of the first fin-type pattern in the first direction, the gate electrode overlaps with an end portion of the first fin-type pattern that includes the first short side of the first fin-type pattern, the first long side of the first fin-type pattern and the second long side of the second fin-type pattern are defined by a second trench having a second depth, which is less than the first depth, at least part of a sidewall of the first fin-type pattern that defines the first short side of the first fin-type pattern is defined by a third trench having a third depth, a sidewall of the third trench is connected to a sidewall of the first trench, and the third depth is less than the first depth and is the same as or less than the second depth.

According to the aforementioned and other embodiments of the present disclosure, the method of fabricating a semiconductor device includes forming first and second fin mask patterns, which extend in a first direction and are arranged along a second direction that is different from the first direction, on a substrate, forming a tapered fin mask pattern having a short side, which extends in the second direction, by removing part of the first fin mask pattern, wherein the second fin mask pattern includes a protrusion portion that protrudes beyond a short side of the tapered fin mask pattern in the first direction, forming a first pre-fin-type pattern using the tapered fin mask pattern and forming a second pre-fin-type pattern using the second fin mask pattern, wherein a short side of the first pre-fin-type pattern is defined by a first trench having a first depth, forming an active region mask pattern, which overlaps with part of the first trench and the first and second pre-fin-type patterns, and forming a second trench having a second depth, which is greater than the first depth, using the active region mask pattern, wherein the forming the second trench, includes etching part of the second pre-fin-type pattern and part of the first pre-fin-type pattern.

According to the aforementioned and other embodiments of the present disclosure, the method of fabricating a semiconductor device includes forming first and second fin mask patterns, which extend in a first direction and are arranged along a second direction that is different from the first direction, on a substrate, forming a tapered fin mask pattern having a short side, which extends in the second direction, by removing part of the first fin mask pattern, wherein the second fin mask pattern includes a protrusion portion that protrudes beyond a short side of the tapered fin mask pattern in the first direction, forming a first pre-fin-type pattern using the tapered fin mask pattern and forming a second pre-fin-type pattern using the second fin mask pattern, wherein a short side of the first pre-fin-type pattern is defined by a first trench having a first depth, forming an active region mask pattern, which overlaps with part of the first trench and the first and second pre-fin-type patterns, and forming a second trench having a second depth, which is greater than the first depth, using the active region mask pattern, wherein the forming the second trench, includes etching part of the second pre-fin-type pattern.

Other features and embodiments may be apparent from the following detailed description, the drawings, and the claims.

BRIEF DESCRIPTION OF THE DRAWINGS

These and/or other aspects and advantages of the present inventive concepts will become apparent and more readily appreciated from the following description of thereby describing in detail example embodiments thereof, taken in conjunction with the accompanying reference to the attached drawings, in which of which.

DETAILED DESCRIPTION OF EMBODIMENTS

Figure 1:
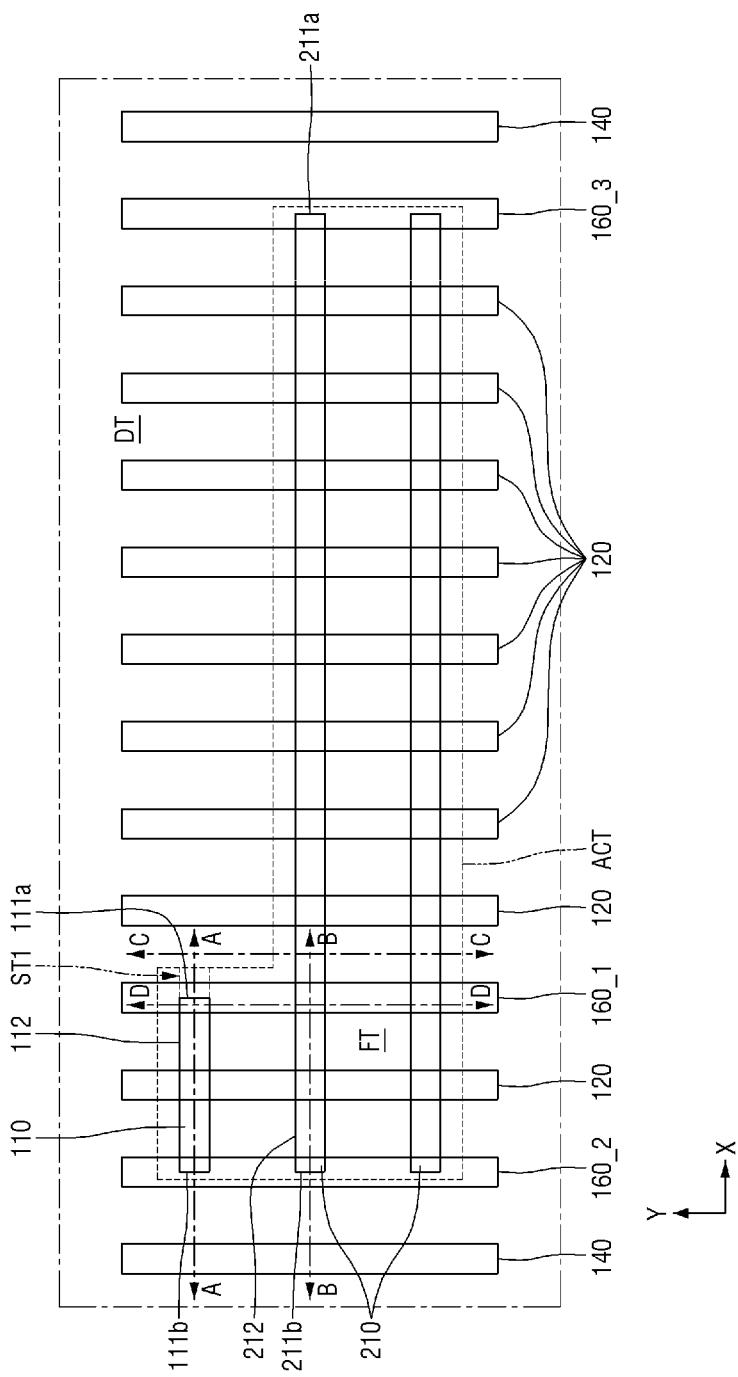
FIG. 1 is a layout view representing a semiconductor device according to some embodiments of the present disclosure.

FIG. 1 is a layout view representing a semiconductor device according to some embodiments of the present disclosure. FIGS. 2 through 5 are cross-sectional views taken along lines A-A, B-B, C-C, and D-D, respectively, of FIG. 1.

Referring to FIGS. 1 through 5, the semiconductor device may comprise a first tapered fin-type pattern 110, at least one first normal fin-type pattern 210, a plurality of normal gate electrodes 120, at least first, second, and third terminal gate electrodes 160_1, 160_2, and 160_3, and a plurality of dummy gate electrodes 140.

In some embodiments, the substrate 100 may comprise a bulk silicon substrate, or a silicon-on-insulator (SOI) substrate. In other embodiments, the substrate 100 may comprise a silicon substrate or may comprise other materials such as silicon germanium, silicon germanium-on-insulator (SGOI), indium antimonide, a lead tellurium compound, indium arsenide, indium phosphide, gallium arsenide, gallium antimonide, or any other suitable substrate material known to those of ordinary skill in the art. In some embodiments, the substrate 100 may comprise a base substrate having an epitaxial layer formed thereon; however, embodiments of the present present disclosure are not limited thereto.

The first tapered fin-type pattern 110 may be formed in an active region ACT. In some embodiments, the first tapered fin-type pattern 110 may have relatively long sides 112, which extend in a first direction X, and first and second short sides 111a and 111b, which extend in a second direction Y. The long sides 112 of the first tapered fin-type pattern 110 may connect with the first and second short sides 111a and 111b of the first tapered fin-type pattern 110. The first short side 111a of the first tapered fin-type pattern 110 may be opposite to the second short side 111b of the first tapered fin-type pattern 110. Thus, from the perspective of a layout view the first tapered fin-type pattern 110 forms strip-like shape having the long sides 112, and the short sides 111a, and 111b.

The first normal fin-type pattern 210 may be formed within the active region ACT. In the active region ACT, at least one normal fin-type pattern 210 may also be formed. The first normal fin-type pattern 210 may have long sides 212, which extend in the first direction X, in a similar direction to the long sides 112 of the first tapered fin-type pattern, and first and second short sides 211a and 211b, which extend in the second direction Y, similar to the short sides 111a and 111b above. The long sides 212 of the first normal fin-type pattern 210 may connect the first and second short sides 211a and 211b of the first normal fin-type pattern 210, creating a substantially strip-like shape. The first short side 211a of the first normal fin-type pattern 210 may be opposite to the second short side 211b of the first normal fin-type pattern 210.

In some embodiments, the first normal fin-type pattern 210 may be positioned in parallel with the first tapered fin-type pattern 110. For example, the long sides 212 of the first normal fin-type pattern 210 may be in parallel from a layout view to the long sides 112 of the first tapered fin-type pattern 110. That is, the first tapered fin-type pattern 110 and the first normal fin-type pattern 210 may be arranged along the second direction Y.

The first normal fin-type pattern 210 may extend beyond the first short side 111a of the first tapered fin-type pattern 110 in the first direction X, making it appear longer from a layout view. That is, when viewed from the second direction Y, a portion of the first normal fin-type pattern 210 overlaps with the first tapered fin-type pattern 110, and a remainder of the first normal fin-type pattern 210 does not overlap with the first tapered fin-type pattern 110.

For example, the second short side 211b of the first normal fin-type pattern 210 and the second short side 111b of the first tapered fin-type pattern 110 may be arranged along the Y direction.

In some embodiments, no additional tapered fin-type patterns may be positioned between the first normal fin-type pattern 210 and the first tapered fin-type pattern 110. In this manner, the first normal fin-type pattern 210 and the first tapered fin-type pattern 110 are considered to be neighboring patterns.

The first tapered fin-type pattern 110 and the first normal fin-type pattern 210 may account for part of the substrate 100 and each may include an epitaxial layer grown from the substrate 100. In some embodiments, the first tapered fin-type pattern 110 and the first normal fin-type pattern 210 may be comprised of the same material. The first tapered fin-type pattern 110 and the first normal fin-type pattern 210 may comprise an element semiconductor material such as, for example, silicon (Si) or germanium (Ge). Alternatively, the first tapered fin-type pattern 110 and the first normal fin-type pattern 210 may comprise a compound semiconductor such as, for example, a IV-IV compound semiconductor a III-V compound semiconductor, or any other suitable elemental or compound semiconductor known to those of ordinary skill in the art.

For example, in the case of the IV-IV compound semiconductor, the first tapered fin-type pattern 110 and the first normal fin-type pattern 210 may comprise a binary or ternary compound including at least two of carbon (C), Si, Ge, and tin (Sn), or a compound obtained by doping the binary or ternary compound with a group IV element. This means that the compound semiconductor may include multiple elements from group IV of the periodic table.

For example, in case of the III-V compound semiconductor, the first tapered fin-type pattern 110 and the first normal fin-type pattern 210 may be comprised of a binary, ternary, or quaternary compound obtained by combining at least one group III element such as aluminum (Al), gallium (Ga), and indium (In) with a group V element such as phosphorus (P), arsenic (As), and antimony (Sb).

A III-V semiconductor compound allows for a variety of possibly compounds with 12 common combinations with the most significant of the group of compounds comprising GaAs, InP, GaP, and GaN In the description that follows herein, it is assumed that the first tapered fin-type pattern 110 and the first normal fin-type pattern 210 are Si fin-type patterns comprising Si.

The active region ACT where the first tapered fin-type pattern 110 and the first normal fin-type pattern 210 are formed may be defined by comprising a deep trench DT having a depth D1.

Figure 5:
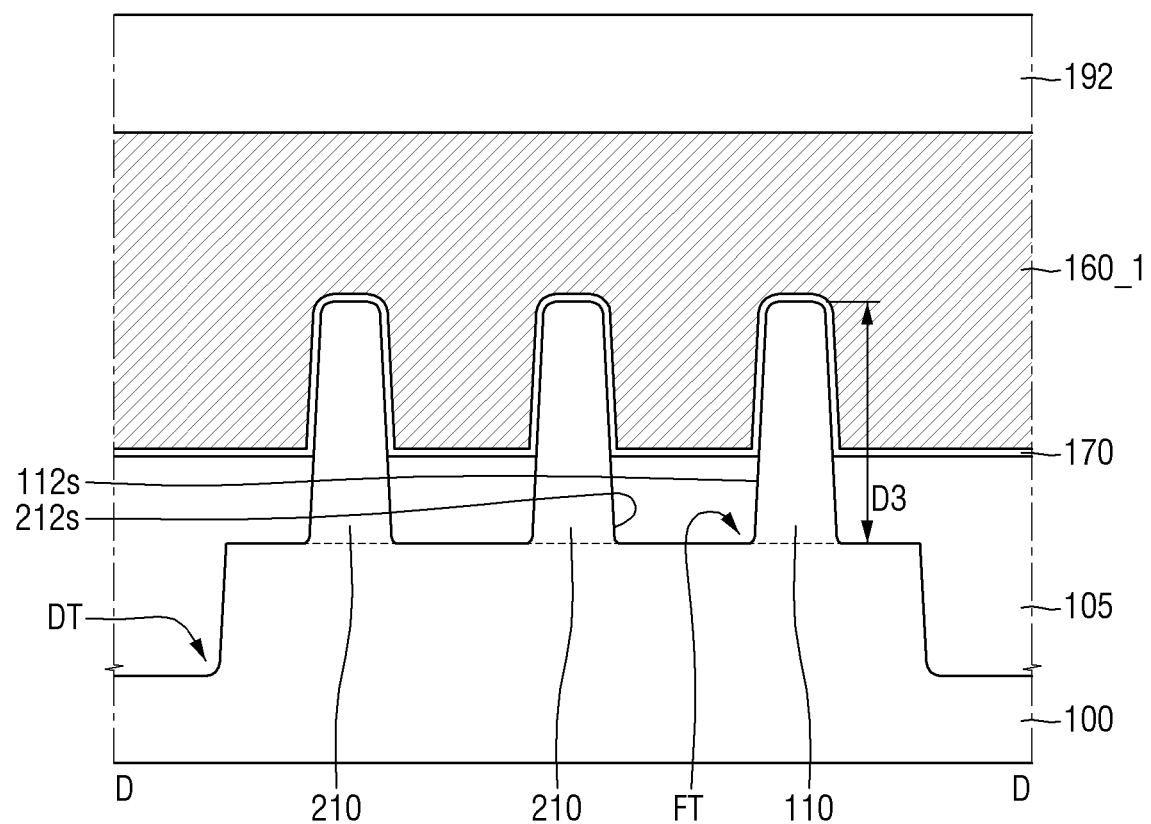

The first tapered fin-type pattern 110 and the first normal fin-type pattern 210 may be defined by a fin trench FT having a depth D3 as shown in FIG. 5. In some embodiments, the depth D3 of the fin trench FT may be less than the depth D1 of the deep trench DT. For example, the long sides 112 of the first tapered fin-type pattern 110 and the long sides 212 of the first normal fin-type pattern 210 may be defined by the fin trench FT. Also, the long sidewalls 112s (it is noted that in this situation, and in other reference numbers herein the letter "s" is used as part of the reference number as it relates to the term "sidewall" it is not being used to pluralize a word, as common) of the first tapered fin-type pattern 110 that define the long sides 112 of the first tapered fin-type pattern 110 and long sidewalls 212s of the first normal fin-type pattern 210 that define the long sides 212 of the first normal fin-type pattern 210 may be defined by or at the fin trench FT.

A first short sidewall 111as of the first tapered fin-type pattern 110 may define the first short side 111a of the first tapered fin-type pattern 110. At least part of the first short sidewall 111as of the first tapered fin-type pattern 110 may be defined by a first shallow trench ST1 having a depth D2. In some embodiments, the first short sidewall 111as of the first tapered fin-type pattern 110 may include at least in part a sidewall of the first shallow trench ST1.

In some embodiments, the depth D2 of the first shallow trench ST1 may be less than the depth D1 of the deep trench DT. The depth D2 of the first shallow trench ST1 may be the same as, or less than, the depth D3 of the fin trench FT, thus creating the fin shape. For example, the depth D1 of the deep trench DT, the depth D2 of the first shallow trench ST1, and the depth D3 of the fin trench FT may be defined with reference to the top surface of the first tapered fin-type pattern 110.

Figure 2:
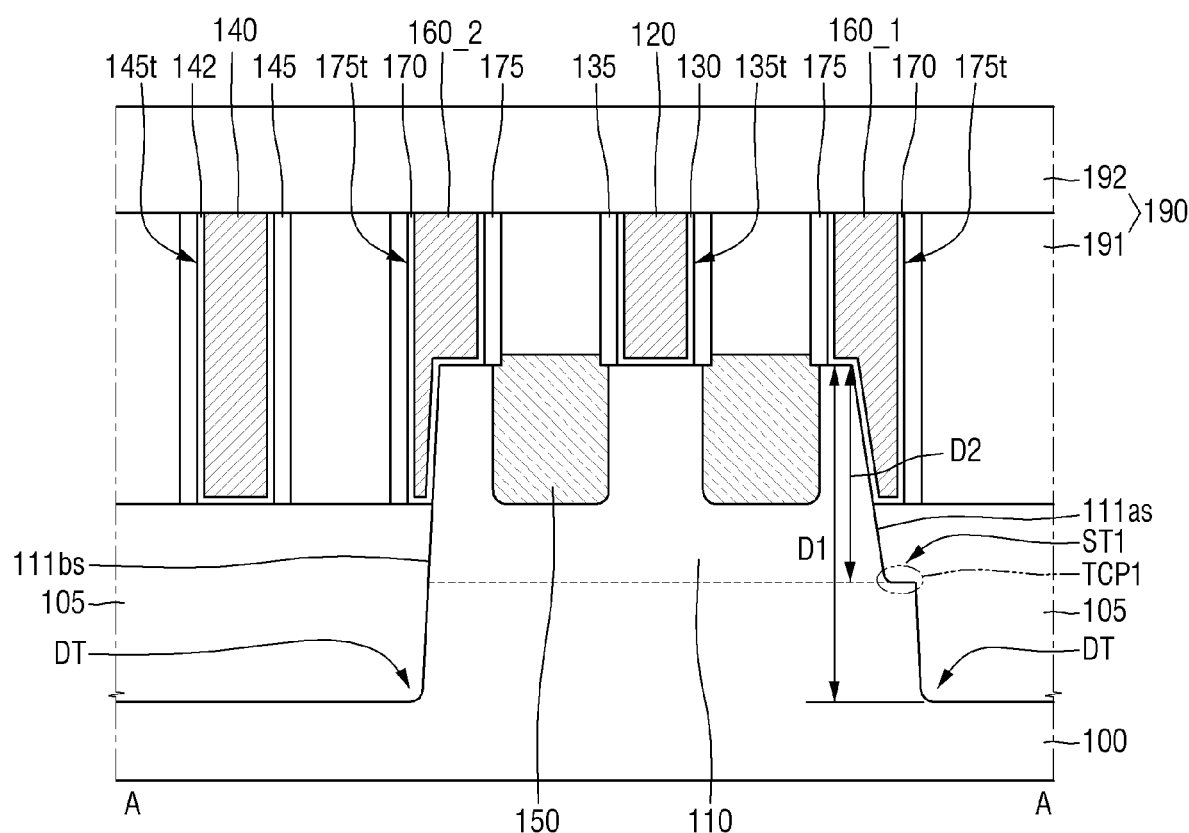
FIGS. 2 through 5 are cross-sectional views taken along lines A-A, B-B, C-C, and D-D, respectively, of FIG. 1.

Referring to FIGS. 2 and 5, the depth D2 of the first shallow trench ST1 may be the same depth D3 as that of the fin trench FT.

In some embodiments, the first shallow trench ST1, which defines the first short sidewall 111*as* of the first tapered fin-type pattern 110, may directly adjoin the deep trench DT. The expression "the first shallow trench ST1 directly adjoins the deep trench DT", as used herein, means that there is not a shallow trench having the depth D2 between the deep trench DT and the first shallow trench ST1.

In some embodiments, a sidewall of the deep trench DT and the sidewall of the first shallow trench ST1 may be connected to each other. A first connecting portion TCP1 may be provided between the sidewall of the deep trench DT and the first shallow trench ST1. The sidewall of the deep trench DT and the sidewall of the first shallow trench ST1 may be connected via the first connecting portion TCP1. The first connecting portion TCP1 may connect the first short sidewall 111*as* of the first tapered fin-type pattern 110 and the sidewall of the deep trench DT. In some embodiments, the first connecting portion TCP1 may be located near the taper, which is also shown as a bend in the fin connection.

The first connecting portion TCP1 may be formed at a location where the sidewall of the deep trench DT and the sidewall of the first shallow trench ST1 are connected and possibly along a bended tapered region. The first connecting portion TCP1 may be defined by the first shallow trench ST1. The first connecting portion TCP1 may include the bottom surface of the first shallow trench ST1. Referring to FIGS. 2 and 5, the depth of the first connecting portion TCP1, i.e., the second depth D2 may be the same as the depth D3 of the fin trench FT.

For example, in some embodiments, a portion where the first connection portion TCP1 and the sidewall of the deep trench DT are connected may have an angular shape, also referred to as bending or tapered shape. In some embodiments, a portion at which the bottom surface of the first shallow trench ST1 and the sidewall of the deep trench DT are connected is not rounded, but instead forms another geometric shape.

The height of the first connecting portion TCP1 may be in the range of the first depth D1 to the second depth D2 with reference to the bottom of the deep trench DT. The height of a part where the sidewall of the deep trench DT and the sidewall of the first shallow trench ST1 are connected may be in the range of the first depth D1 to the second depth D2.

The slope of the sidewall of the deep trench DT may take a variety of shapes and the slope of the sidewall of the first shallow trench ST1 simply represents one of many possible slopes.

A second short sidewall 111*bs* of the first tapered fin-type pattern 110 may define the second short side 111*b* of the first tapered fin-type pattern 110. The second short sidewall 111*bs* of the first tapered fin-type pattern 110 may be defined by the deep trench DT. The second short sidewall 111*bs* of the first tapered fin-type pattern 110 may include at least in part the sidewall of the deep trench DT.

A short sidewall 211*bs* of the first normal fin-type pattern 210 that defines the second short side 211*b* of the first normal fin type pattern 210 may be defined by the deep trench DT. The short sidewall 211*bs* may include the sidewall of the deep trench DT. In other embodiments, a short sidewall of the first normal fin-type pattern 210 that defines the first short side 211*a* of the first normal fin type pattern 210 may also be defined by the deep trench DT (not shown).

Figure 4:
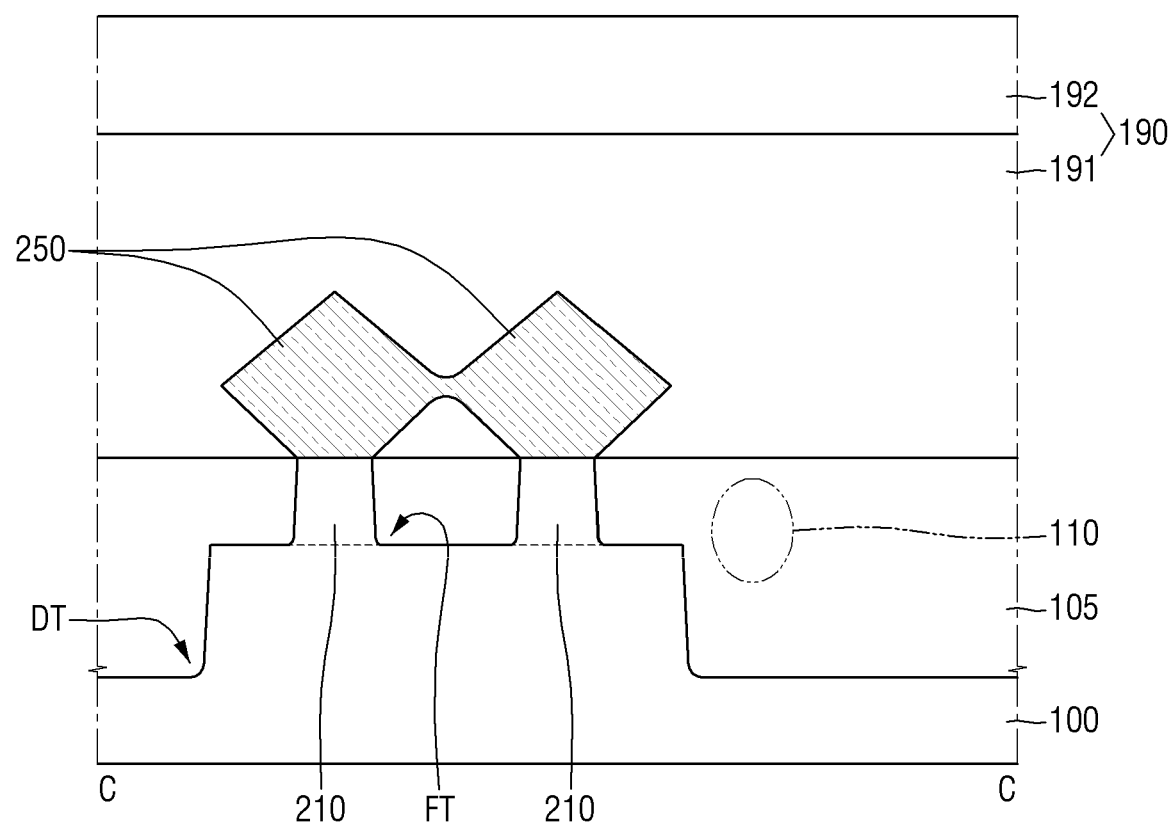

Referring to FIGS. 4 and 5, the deep trench DT may be formed in a region of the semiconductor system where the first tapered fin-type pattern 110 is to be formed.

A field insulating film 105 may be formed on the substrate 100. In some embodiments, a field insulting film may comprise an oxide film, approximately formed on the entire surface of the substrate where a trench is formed, and then the oxide film is etched-back, to thereby form a field insulating film for filling the trench.

In some embodiments, the field insulating film 105 may partially fill the deep trench DT, the first shallow trench ST1, and the fin trench FT. In addition, in some embodiments, the field insulating film 105 may surround a portion of the first tapered fin-type pattern 110 and a portion of the first normal fin-type pattern 210. Furthermore, the field insulating film 105 may partially cover the long sidewalls 112*s* and the first and second short sidewalls 111*as* and 111*bs* of the first tapered fin-type pattern 110 and the long sidewalls 212*s* and the short sidewall 211*bs* of the first normal fin-type pattern 210.

The top surfaces of the first tapered fin-type pattern 110 and the first normal fin-type pattern 210 may protrude beyond or past the top surface of the field insulating film 105, which is formed on the long sidewalls 112*s* of the first tapered fin-type pattern 110 and the long sidewalls 212*s* of the first normal fin-type pattern 210. The first tapered fin-type pattern 110 and the first normal fin-type pattern 210 may be defined in a variety of ways by the field insulating film 105.

From the perspective for FIGS. 4 and 5, the top surface of the field insulating film 105 may be located at a positioned that is higher than the part of the sidewall where the deep trench DT and the sidewall of the first shallow trench ST1 connect, with respect to the top surface of the first tapered fin-type pattern 110. As an example, the distance from the top surface of the first tapered fin-type pattern 110 to the top surface of the field insulating film 105 may be less than the depth D2 of the first shallow trench ST1.

In some embodiments, the first connecting portion TCP1, which is included in the first short sidewall 111*as* of the first tapered fin-type pattern 110, may also be covered by the field insulating film 105.

In some embodiments, the field insulating film 105 may comprise one or more of the following compounds, silicon oxide, silicon nitride, silicon oxynitride, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, polyimide, a porous polymeric material, a combination thereof, or other suitable insulating material.

In some embodiments, the field insulating film 105 may comprise at least one field liner film, which is formed between the first tapered fin-type pattern 110 and the field insulating film 105 and between the first normal fin-type pattern 210 and the field insulating film 105. In a case where the field insulating film 105 includes the field liner film, the field liner film may comprise at least one of polysilicon, amorphous silicon, silicon oxynitride, silicon nitride, silicon oxide, or other suitable material.

FIGS. 2 and 4 illustrate an embodiment wherein a portion of the field insulating film 105 that fills part of the deep trench DT comprises the same material as a portion of the field insulating film 105 that fills part of the first shallow trench ST1 and the fin trench FT. However, embodiments of the present disclosure are not limited thereto. For example, in some embodiments, the portion of the field insulating film 105 that fills part of the deep trench DT may comprise a material that is different than the portion of the field insulating film 105 that fills part of the first shallow trench ST1 as well as the fin trench FT.

The normal gate electrodes 120 may extend over the field insulating film 105 along the second direction Y. The normal gate electrodes 120 may be formed on the first tapered fin-type pattern 110 and the first normal fin-type pattern 210 to intersect the first tapered fin-type pattern 110 and the first normal fin-type pattern 210. In other embodiments, the normal gate electrodes 120 may be formed on the first normal fin-type pattern 210 to intersect the first normal fin-type pattern 210.

In some embodiments, the normal gate electrodes 120 may overlap with the long sides 112 of the first tapered fin-type pattern 110 and/or the long sides 212 of the first normal fin-type pattern 210, as shown in FIG. 1. In some embodiments, the normal gate electrodes 120 do not overlap with the first and second short sides 111a and 111b of the first tapered fin-type pattern 110 and the first and second short sides 211a and 211b of the first normal fin-type pattern 210.

Also shown in FIG. 1, the first, second, and third terminal gate electrodes 160_1, 160_2, and 160_3 may extend over the field insulating film 105 along the second direction Y. The first and second terminal gate electrodes 160_1 and 160_2 may be formed on the first tapered fin-type pattern 110 and the first normal fin-type pattern 210 and may intersect the first tapered fin-type pattern 110 and the first normal fin-type pattern 210. The third terminal gate electrode 160_3 may be formed on the first normal fin-type pattern 210 to intersect the first normal fin-type pattern 210.

The first terminal gate electrode 160_1 may overlap with a first end portion of the first tapered fin-type pattern 110 that comprises or encompasses the first short side 111a of the first tapered fin-type pattern 110. The second terminal gate electrode 160_2 may overlap with a second end portion of the first tapered fin-type pattern 110 that comprises or encompasses the second short side 111b of the first tapered fin-type pattern 110. In an embodiment in which, the second short side 211b of the first normal fin-type pattern 210 and the second short side 111b of the first tapered fin-type pattern 110 extend in the second direction Y, the second terminal gate electrode 160_2 may overlap with a second end portion of the first normal fin-type pattern 210 that comprises the second short side 211b of the first normal fin-type pattern 210. In some embodiments the third terminal gate electrode 160_3 may overlap with a first end portion of the first normal fin-type pattern 210 that includes the first short side 211a of the first normal fin-type pattern 210.

It is noted that in a layout view of FIG. 1 that the normal electrodes 120 and the terminal gate electrodes 160_1, 160_2, and 160_3 are substantially parallel with each other and are substantially perpendicular to the tapered fin type patterns 110 and the normal fin type patterns 210. Other configurations are possible, including non-parallel and non-perpendicular configurations.

Figure 3:
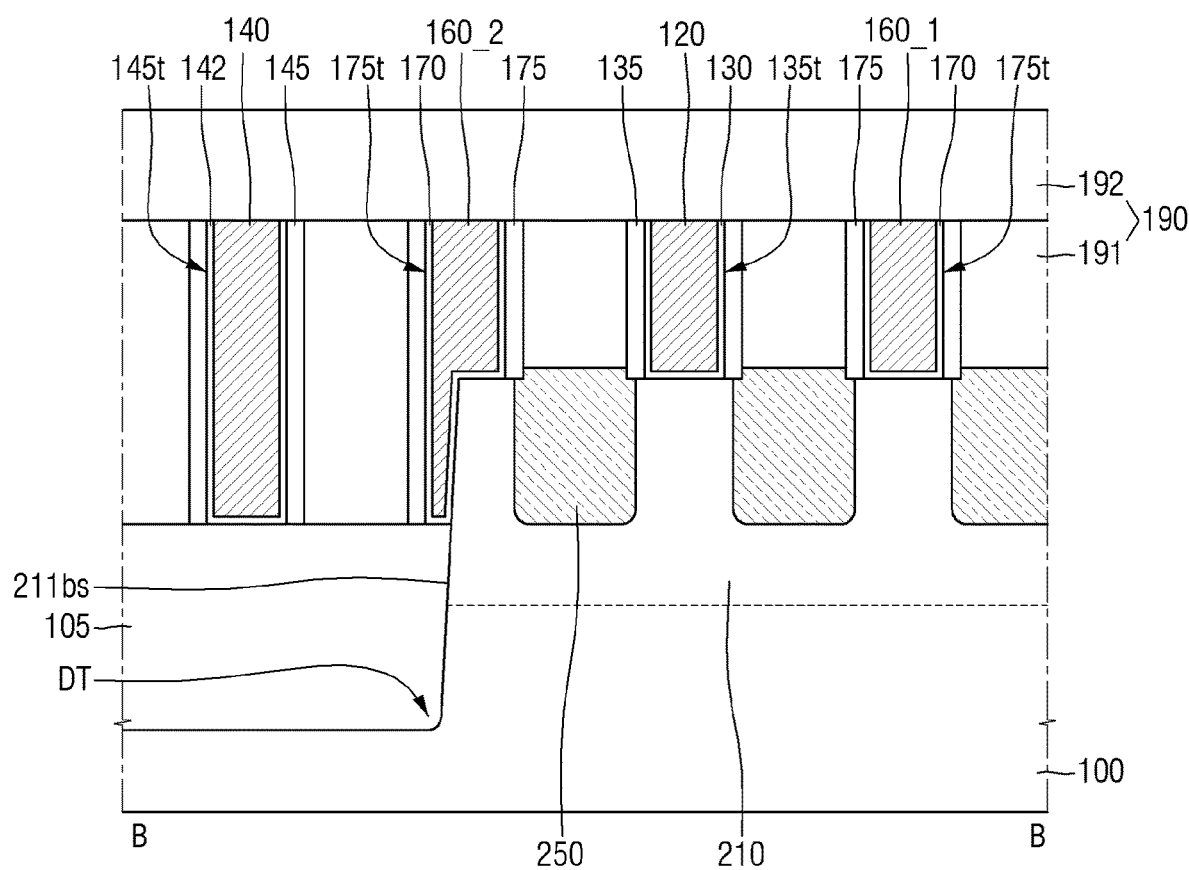

FIGS. 2 and 3 represents an embodiment wherein the first terminal gate electrode 160_1 surrounds the first end portion of the first tapered fin-type pattern 110, the second terminal gate electrode 160_2 surrounds the second end portion of the first tapered fin-type pattern 110 and the second end portion of the first normal fin-type pattern 210, and the third terminal gate electrode 160_3 surround the first end portion of the first normal fin-type pattern 210. In some embodiments, it is sufficient that at least some of the first, second, and third terminal gate electrodes 160_1, 160_2, and 160_3 overlap with the top surface of the first tapered fin-type pattern 110 and/or the top surface of the first normal fin-type pattern 210.

From the perspective of a layout view, the first terminal gate electrode 160_1 may overlap with the location where the sidewall of the first shallow trench ST1 and the sidewall of the deep trench DT connect. In one embodiment, in a layout view, the first terminal gate electrode 160_1 may at least partially overlap with the first connecting portion TCP1. In a layout view, the first terminal gate electrode 160_1 may overlap with the entire first connecting portion TCP1 and at least part of the sidewall of the deep trench DT.

One normal gate electrode 120 may be formed between the first and second terminal gate electrodes 160_1 and 160_2, and eight normal gate electrodes 120 may be formed between the first and third terminal gate electrodes 160_1 and 160_3. However, the present disclosure is not limited to this embodiment. For example, in some embodiments, no normal gate electrodes are provided or positioned between a pair of adjacent terminal gate electrodes.

The dummy gate electrodes 140 may extend over the field insulating film 105 along the second direction Y. In some embodiments, the dummy gate electrodes 140 do not intersect the first tapered fin-type pattern 110 and the first normal fin-type pattern 210.

The normal gate electrodes 120 and the first, second, and third terminal gate electrodes 160_1, 160_2, and 160_3 may be positioned between the dummy gate electrodes 140. The first tapered fin-type pattern 110 and the first normal fin-type pattern 210 may be positioned between the dummy gate electrodes 140.

In some embodiments, the normal gate electrodes 120, the first, second, and third terminal gate electrodes 160_1, 160_2, and 160_3, and the dummy gate electrodes 140 may comprise at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), a combination thereof, or other suitable material for forming the gate electrodes.

The normal gate electrodes 120, the first, second, and third terminal gate electrodes 160_1, 160_2, and 160_3, and the dummy gate electrodes 140 may be formed for example, using a replacement process or a gate last process; however, embodiments of the present disclosure are not limited thereto.

In some embodiments, normal spacers 135 may be formed on the sidewalls of each of the normal gate electrodes 120. The normal spacers 135 may define a normal gate trench 135t. Each of the normal gate electrodes 120 may be formed in the normal gate trench 135t. Terminal spacers 175 may be formed on the sidewalls of each of the first, second, and third terminal gate electrodes 160_1, 160_2, and 160_3. The geometry of the terminal spacers 175 may define a terminal gate trench 175t. Each of the first, second, and third terminal gate electrodes 160_1, 160_2, and 160_3 may be formed in the terminal gate trench 175t. In some embodiments, dummy spacers 145 may be formed on the sidewalls of each of the dummy gate electrodes 140. The dummy spacers 145 may define a dummy gate trench 145t. Each of the dummy gate electrodes 140 may be formed and defined in the dummy gate trench 145t. The normal spacers 135, the dummy spacers 145, and the terminal spacers 175 may comprise, at least one of silicon nitride (SiN), silicon oxynitride (SiON), silicon oxide (SiO$_2$), silicon oxycarbonitride (SiOCN), or any other suitable spacer material.

In a layout view, the terminal spacers 175 may partially overlap with the first connecting portion TCP1. In other embodiments, the terminal spacers 175 may at least partially overlap with the sidewall of the deep trench DT.

A normal gate insulating film 130 and a terminal gate insulating film 170 may be formed on any of a number of surfaces including the first tapered fin-type pattern 110, the first normal fin-type pattern 210, and the field insulating film 105. The normal gate insulating film 130 may be formed along the sidewalls and the bottom surface of the normal gate trench 135t. Furthermore, the terminal gate insulating film 170 may be formed along the sidewalls and the bottom surface of the terminal gate trench 175t. The normal gate insulating film 130 and the terminal gate insulating film 170 may be formed along the profile or sidewall portions of the first tapered fin-type pattern 110, which protrudes beyond the field insulating film 105 and/or the profile of the first normal fin-type pattern 210, which also protrudes beyond the field insulating film 105. The normal gate electrodes 120 may be formed on the normal gate insulating film 130, and the first, second, and third terminal gate electrodes 160_1, 160_2, and 160_3 respectively, may be formed on the terminal gate insulating film 170. A dummy gate insulating film 142 may be formed along the top surface of the field insulating film 105. The dummy gate insulating film 142 may be formed along the sidewalls and the bottom surface of the dummy gate trench 145t.

As represented in FIGS. 2 and 3, an interfacial film may be formed between the normal gate insulating film 130 and the first tapered fin-type pattern 110, between the normal gate insulating film 130 and the first normal fin-type pattern 210, between the terminal gate insulating film 170 and the first tapered fin-type pattern 110, and between the terminal gate insulating film 170 and the first normal fin-type pattern 210. In a case where the first tapered fin-type pattern 110 and the first normal fin-type pattern 210 are Si fin-type patterns, the interfacial film may comprise silicon oxide.

In some embodiments, the normal gate insulating film 130, the dummy gate insulating film 142, and the terminal gate insulating film 170 may comprise a high-k material having a higher dielectric constant than a silicon oxide film. The high-k material may comprise at least one from the group of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, a combination thereof, or other suitable material.

First epitaxial patterns 150 may be formed between the normal gate electrodes 120 and the first and second terminal gate electrodes 160_1 and 160_2 or between the various normal gate electrodes 120. Additionally, the first epitaxial patterns 150 may be formed on the first tapered fin-type pattern 110. Second epitaxial patterns 250 may be formed between the normal gate electrodes 120 and the first and second terminal gate electrodes 160_1 and 160_2 or between the normal gate electrodes 120. Similarly, the second epitaxial patterns 250 may be formed on the first normal fin-type pattern 210.

The first epitaxial patterns 150 may be included in a source and a drain of a transistor that uses the first tapered fin-type pattern 110 as a channel region, and the second epitaxial patterns 250 may be included in a source and drain of a transistor that uses the first normal fin-type pattern 210 as a channel region. FIG. 4 illustrates that a pair of second epitaxial patterns 250 formed on a respective pair of adjacent first normal fin-type patterns 210 are placed in contact with each other; however, embodiments of the present disclosure are not limited thereto.

In some embodiments, an interlayer insulating film 190 may include a lower interlayer insulating film 191 and an upper interlayer insulating film 192. The lower interlayer insulating film 191 may cover the first epitaxial patterns 150 and the second epitaxial patterns 250.

In one embodiment, the top surface of the lower interlayer insulating film 191 may be coplanar with the top surfaces of the normal gate electrodes 120, the top surfaces of the dummy gate electrodes 140, and the top surfaces of the first, second, and third terminal gate electrodes 160_1, 160_2, and 160_3. The upper interlayer insulating film 192 is formed on the lower interlayer insulating film 191. The upper interlayer insulating film 192 is formed on the top surfaces of the normal gate electrodes 120, the top surfaces of the dummy gate electrodes 140, and the first, second, and third terminal gate electrodes 160_1, 160_2, and 160_3 respectively.

The lower interlayer insulating film 191 and the upper interlayer insulating film 192 may comprise, a film selected from the group, for example, silicon oxide, silicon nitride, silicon oxynitride, FOX, TOSZ, USG, BSG, PSG, BPSG, PETEOS, FSG, CDO, xerogel, aerogel, amorphous fluorinated carbon, OSG, parylene, BCB, SiLK, polyimide, a porous polymeric material, a combination thereof, or any other suitable insulating material.

Figure 6:
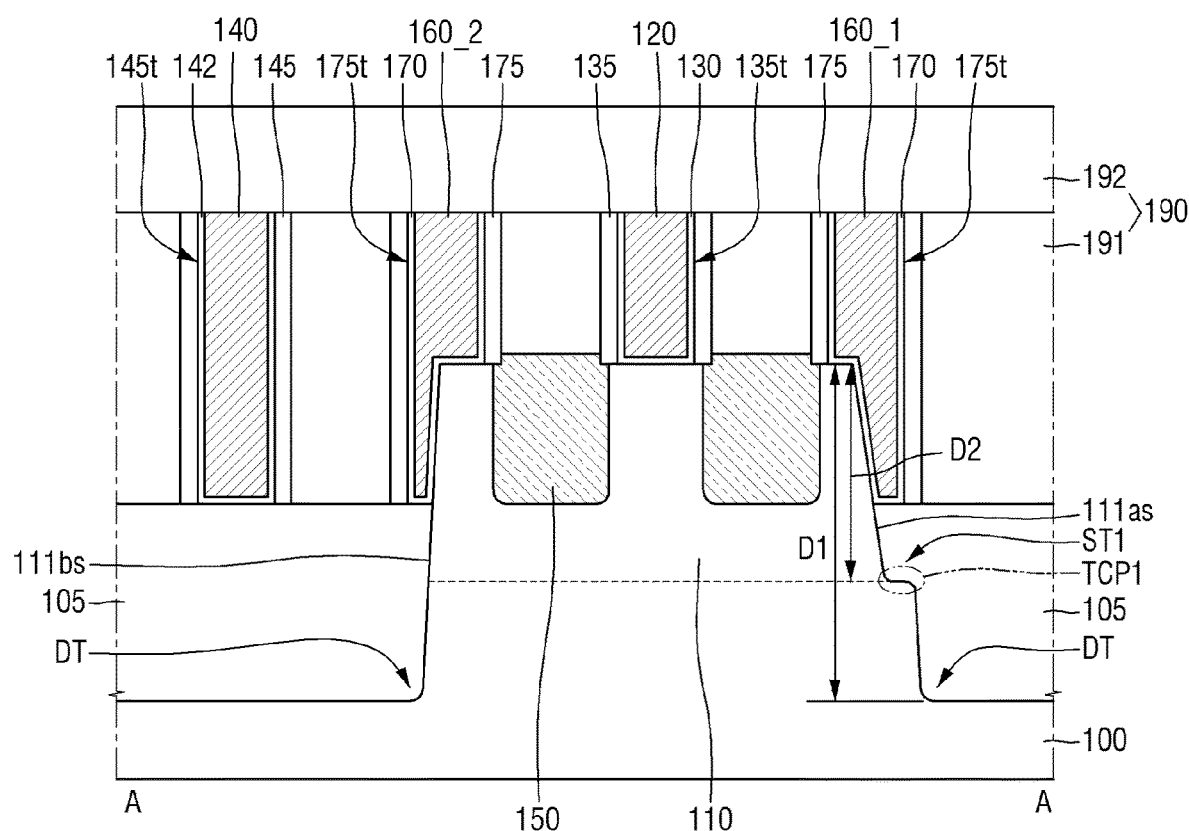
FIGS. 6 through 8 are cross-sectional views representing semiconductor devices according to some embodiments of the present disclosure.
Figure 7:
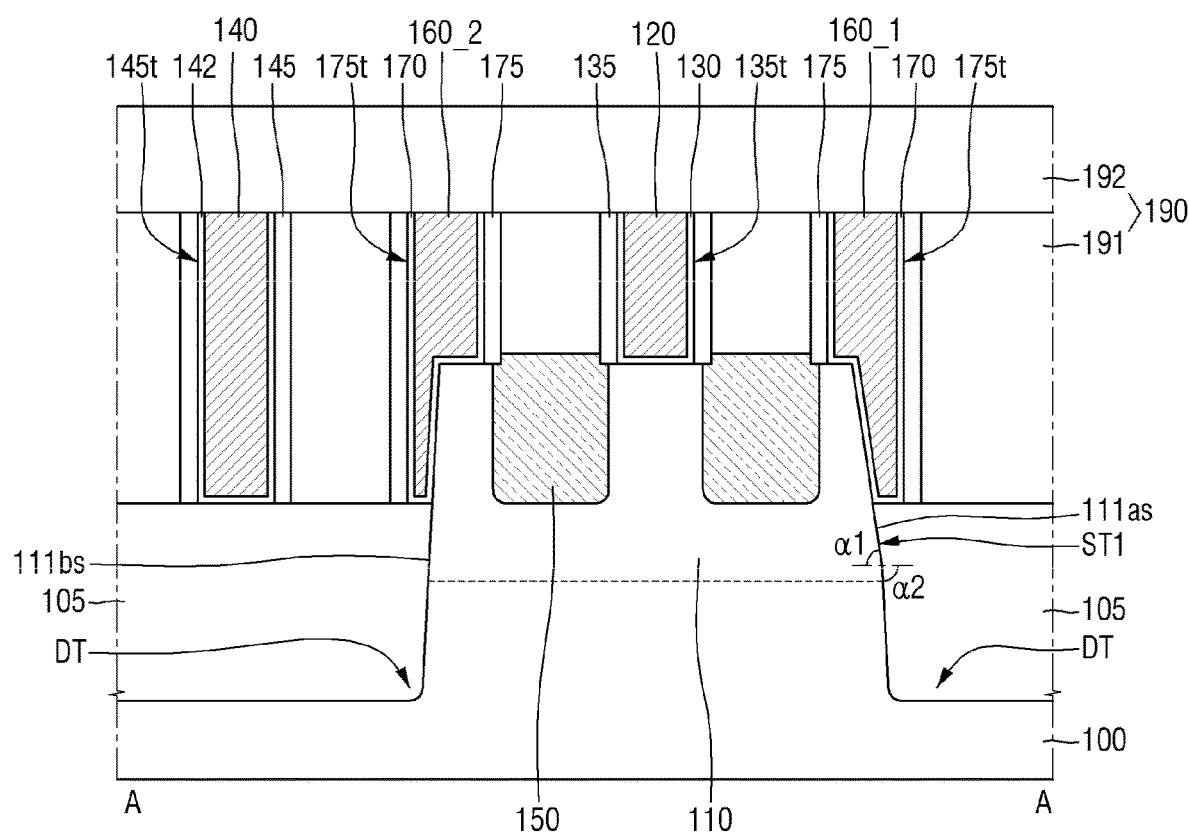
Figure 8:
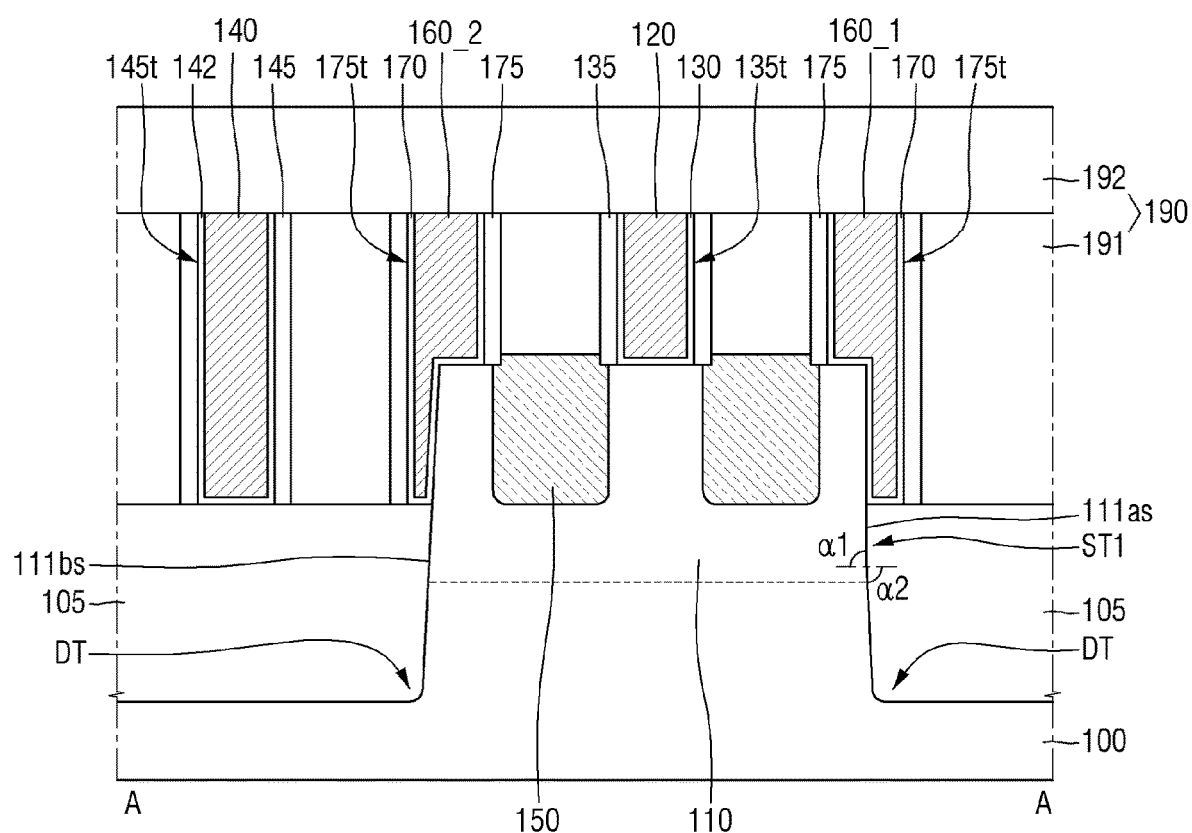

FIGS. 6 through 8 are cross-sectional views representing semiconductor devices according to some embodiments of the present disclosure. For convenience, the embodiments of FIGS. 6 through 8 will hereinafter be described, focusing mainly on differences with the embodiment of FIGS. 1 through 5.

Referring to FIG. 6, a first connecting portion TCP1 of a first short sidewall 111as of a first tapered fin-type pattern 110 may be relatively rounded, as opposed to a sharp or squared interface.

Shown is the embodiment where the first connecting portion TCP1 and a sidewall of a deep trench DT are connected and in some embodiments may have a round shape. A part at where the bottom surface of a first shallow trench ST1 and the sidewall of the deep trench DT are connected may be rounded in certain configurations.

Referencing the configurations of the embodiments depicted in FIGS. 7 and 8, in some embodiments the sidewall of the deep trench DT may be directly connected to a sidewall of the first shallow trench ST1.

A first slope α1 of the sidewall of the deep trench DT may be different from a second slope α2 of the sidewall of the first shallow trench ST1.

In this embodiment, the first connecting portion TCP1 is not formed between the sidewall of the deep trench DT and the sidewall of the first shallow trench ST1. However, the top surface of a field insulating film 105 may be located higher than a part where the sidewall of the deep trench DT and the sidewall of the first shallow trench ST1 are connected, with respect to the top surface of the first tapered fin-type pattern 110.

Referring to FIGS. 5, 7, and 8, in some embodiments, the depth of the part where the sidewall of the deep trench DT and the sidewall of the first shallow trench ST1 directly meet may be less than a depth D3 of the bottom surface of a fin trench FT; however, embodiments of the present disclosure are not limited thereto.

In a case where the part where the sidewall of the deep trench DT and the sidewall of the first shallow trench ST1 directly meet is higher than the bottom surface of the fin trench FT, the first short sidewall 111as of the first tapered fin-type pattern 110 may include part of the sidewall of the deep trench DT and all of or part of the sidewall of the first shallow trench ST1.

Referring to FIG. 7, the slope α1 of the sidewall of the deep trench DT may be less than a slope α2 of the sidewall of the first shallow trench ST1. Alternatively, referring to FIG. 8, the slope α1 of the sidewall of the deep trench DT may be greater than the slope α2 of the sidewall of the first shallow trench ST1.

Figure 9A:
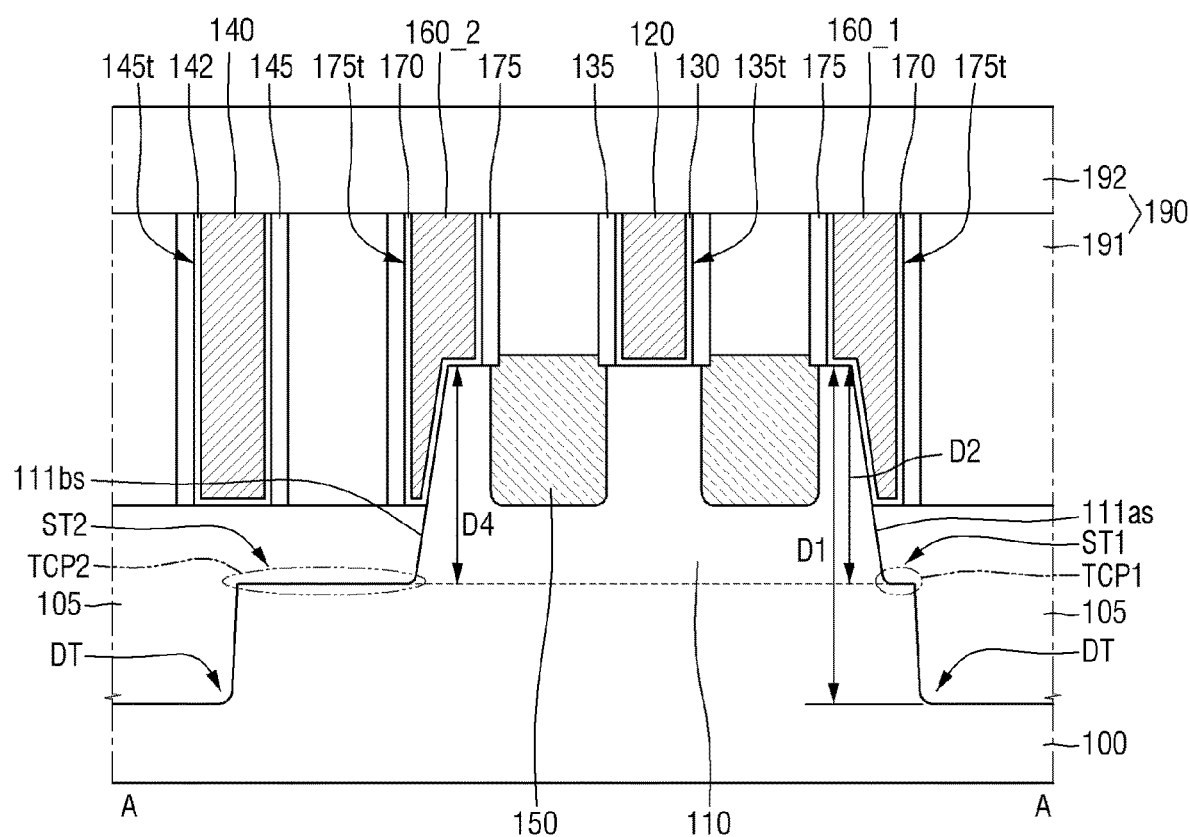
FIGS. 9A and 9B are cross-sectional views representing semiconductor devices according to some embodiments of the present disclosure.
Figure 9B:
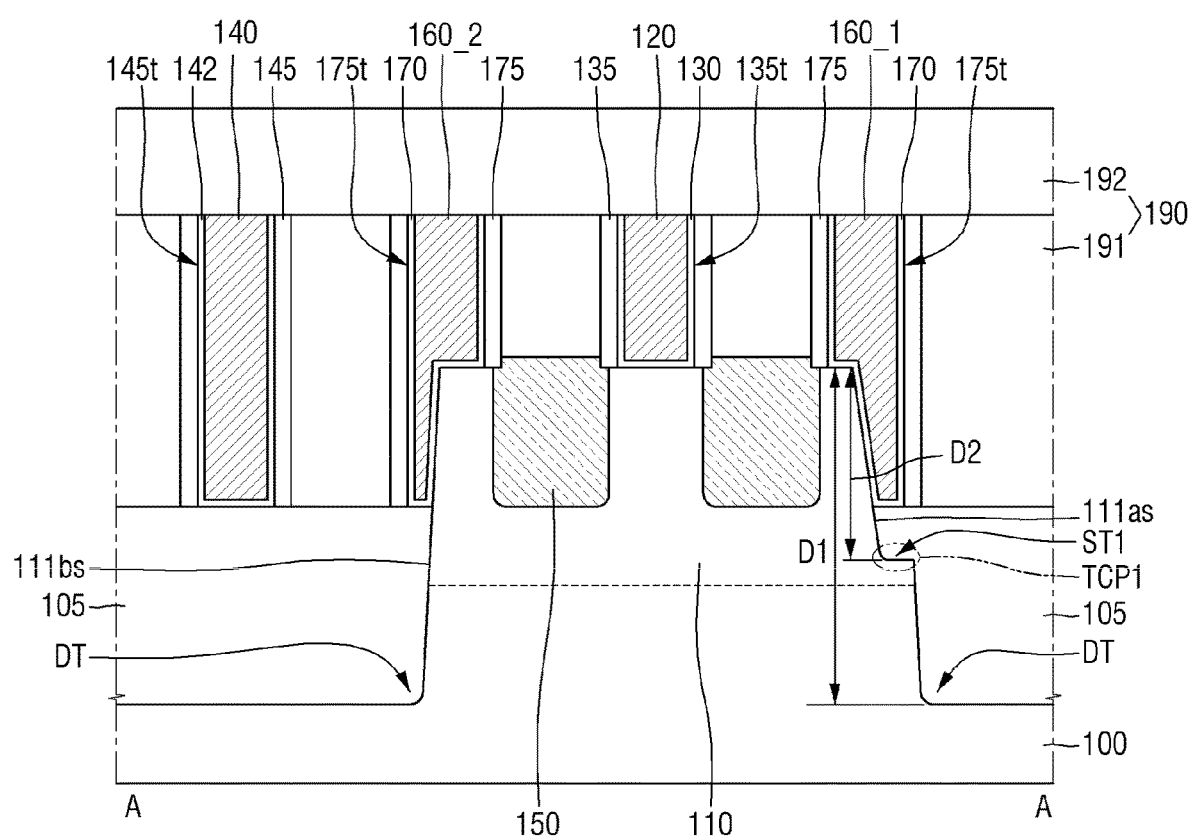

FIGS. 9A and 9B are cross-sectional views representing semiconductor devices according to some embodiments of the present disclosure. For convenience, the embodiments of FIGS. 9A and 9B will hereinafter be described, focusing mainly on differences with the embodiment of FIGS. 1 through 5.

Referring to FIG. 9A, at least part of a second short sidewall 111bs of a first tapered fin-type pattern 110 that defines a second short side 111b (not shown) of the first tapered fin-type pattern 110 may be defined by a second shallow trench ST2 having a depth D4. The second short sidewall 111bs of the first tapered fin-type pattern 110 may include a sidewall or part of a sidewall of the second shallow trench ST2. The second shallow trench ST2, which defines the second short sidewall 111bs of the first tapered fin-type pattern 110, may directly adjoin a deep trench DT.

In some embodiments, the depth D4 of the second shallow trench ST2 may be less than a depth D1 of the deep trench DT. The depth D4 of the second shallow trench ST2 may be defined by reference to the top surface of the first tapered fin-type pattern 110.

In the present embodiment, a first shallow trench ST1 and the second shallow trench ST2 may be formed simultaneously. The depth D4 of the second shallow trench ST2 may be substantially the same as the depth D2 of the first shallow trench ST1.

A sidewall of the deep trench DT and the sidewall of the second shallow trench ST2 may be connected. In some embodiments, a second connecting portion TCP2 is be provided between the sidewall of the deep trench DT and the sidewall of the second shallow trench ST2. The sidewall of the deep trench DT and the sidewall of the second shallow trench ST2 may be connected via the second connecting portion TCP2.

In some embodiments, the second connecting portion TCP2 may connect the second short sidewall 111bs of a first tapered fin-type pattern 110 and the sidewall of the deep trench DT. The second connecting portion TCP2 may be formed at a part of the semiconductor where the sidewall of the deep trench DT and the sidewall of the second shallow trench ST2 connect. The second connecting portion TCP2 may include the bottom surface of the second shallow trench ST2.

In some embodiments, the width of the second connecting portion TCP2 in a first direction X may be different from the width of a first connecting portion TCP1 in the first direction X. In a case where the second connecting portion TCP2 has a different width from the first connecting portion TCP1, the width of the second connecting portion TCP2 in the first direction X may be greater than the width of the first connecting portion TCP1 in the first direction X. In some embodiments the respective widths of the first and second connecting portions TCP1, TCP2 may be the same.

In a layout view, a second terminal gate electrode 160_2 may overlap with the sidewall of the second shallow trench ST2. In a plan view, the second terminal gate electrode 160_2 may partially overlap with the second connecting portion TCP2.

In a layout view, the second terminal gate electrode 160_2 does not overlap with the sidewall of the deep trench DT. In a layout view, at least part of the sidewall of the deep trench DT may overlap with a dummy gate electrode 140 adjacent to the second short side 111b of the first tapered fin-type pattern 110.

FIG. 9A represents an embodiment wherein the second connecting portion TCP2 is provided to connect the sidewall of the deep trench DT and the sidewall of the second shallow trench ST2. This allows for an alternative configuration where the sidewall of the deep trench DT and the sidewall of the second shallow trench ST2 may directly connect to each other.

Although not shown exactly, a short sidewall of a first normal fin-type pattern 210 that defines a second short side 211b of the first normal fin-type pattern 210 may also be defined by the second shallow trench ST2 having the depth D4.

In some embodiments, the top surface of a field insulating film 105 is located higher than the position where the sidewall of the deep trench DT and the sidewall of the second shallow trench ST2 are connected, with respect to the top surface of the first tapered fin-type pattern 110. The distance from the top surface of the first tapered fin-type pattern 110 to the top surface of the field insulating film 105 may be less than the depth D4 of the second shallow trench ST2.

Referring to FIG. 9B, the depth D2 of the first shallow trench ST1 may be less than the depth of a fin trench FT (for example, the depth D3 of FIG. 5).

In this embodiment, a first short sidewall 111as of the first tapered fin-type pattern 110 may include the sidewall of the deep trench DT and the sidewall of the first shallow trench ST1. The first short sidewall 111as of the first tapered fin-type pattern 110 may be formed to connect the sidewall of the deep trench DT and the sidewall of the first shallow trench ST1.

The depth D2 of the first connecting portion TCP1 where the sidewall of the deep trench DT and the sidewall of the first shallow trench ST1 are connected may be less than the depth D3 of the fin trench FT and the depth D1 of the deep trench DT.

Figure 10:
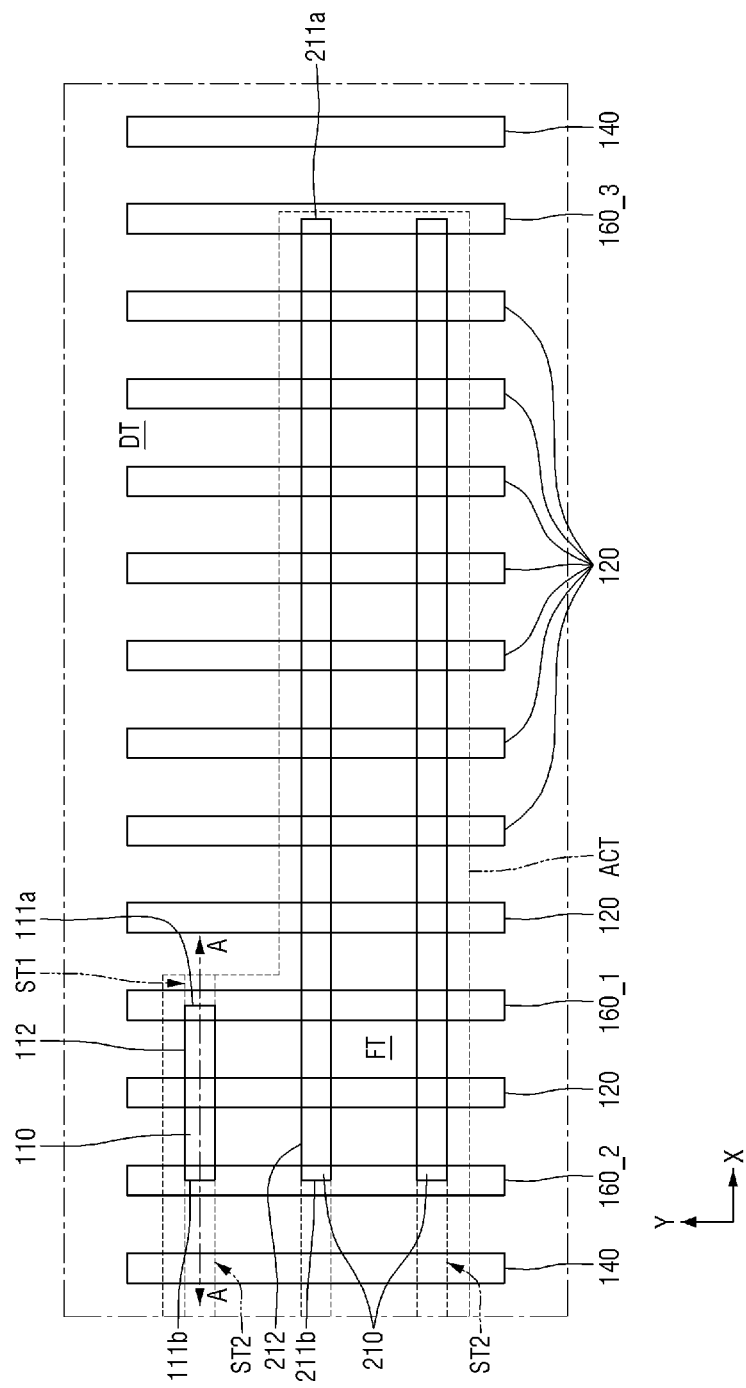
FIG. 10 is a layout view representing a semiconductor device according to some embodiments of the present disclosure.
Figure 11:
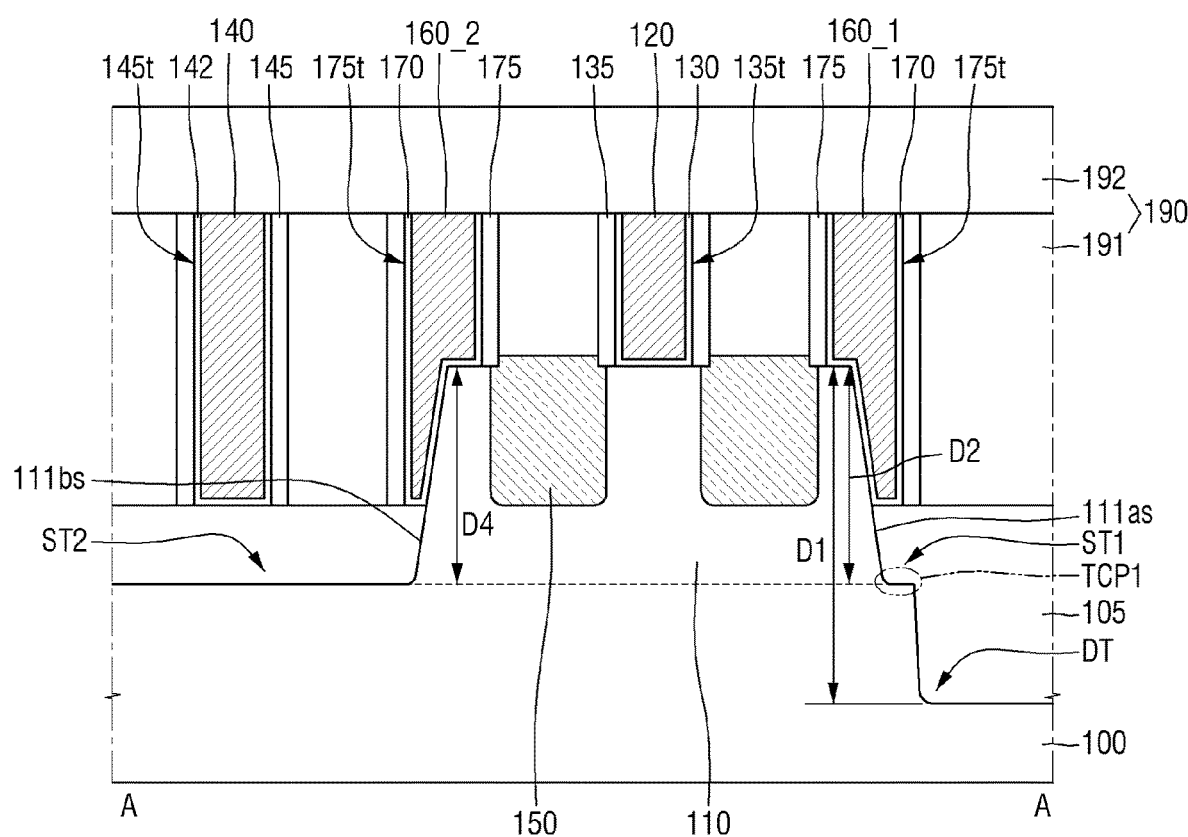
FIG. 11 is a cross-sectional view taken along line A-A of FIG. 10.

FIG. 10 is a layout view representing a semiconductor device according to some embodiments of the present disclosure. FIG. 11 is a cross-sectional view taken along line A-A of FIG. 10. For convenience, the embodiment of FIGS. 10 and 11 will herein be described, focusing mainly on differences with the embodiment of FIGS. 1 through 5.

Referring to the embodiments shown in FIGS. 10 and 11, a deep trench DT is not formed along a second short side 111b of a first tapered fin-type pattern 110 and a second short side 211b of a first normal fin-type pattern 210, which are arranged in a second direction Y.

In the present embodiment, a second short sidewall 111bs of the first tapered fin-type pattern 110 that defines the second short side 111b of the first tapered fin-type pattern 110 may be defined by a second shallow trench ST2 having a depth D4. The second short sidewall 111bs of the first tapered fin-type pattern 110 may include a sidewall of the second shallow trench ST2. A short sidewall 211bs of the first normal fin-type pattern 210 that defines the second short side 211b of the first normal fin-type pattern 210 may also be defined by the second shallow trench ST2. The short sidewall 211bs of the first normal fin-type pattern 210 may include the sidewall of the second shallow trench ST2.

In some embodiments, the depth D4 of the second shallow trench ST2 may be less than a depth D1 of the deep trench DT. The first shallow trench ST1 and the second shallow trench ST2 may be formed contemporaneously. The depth D4 of the second shallow trench ST2 may be substantially the same as a depth D2 of the first shallow trench ST1.

Figure 12:
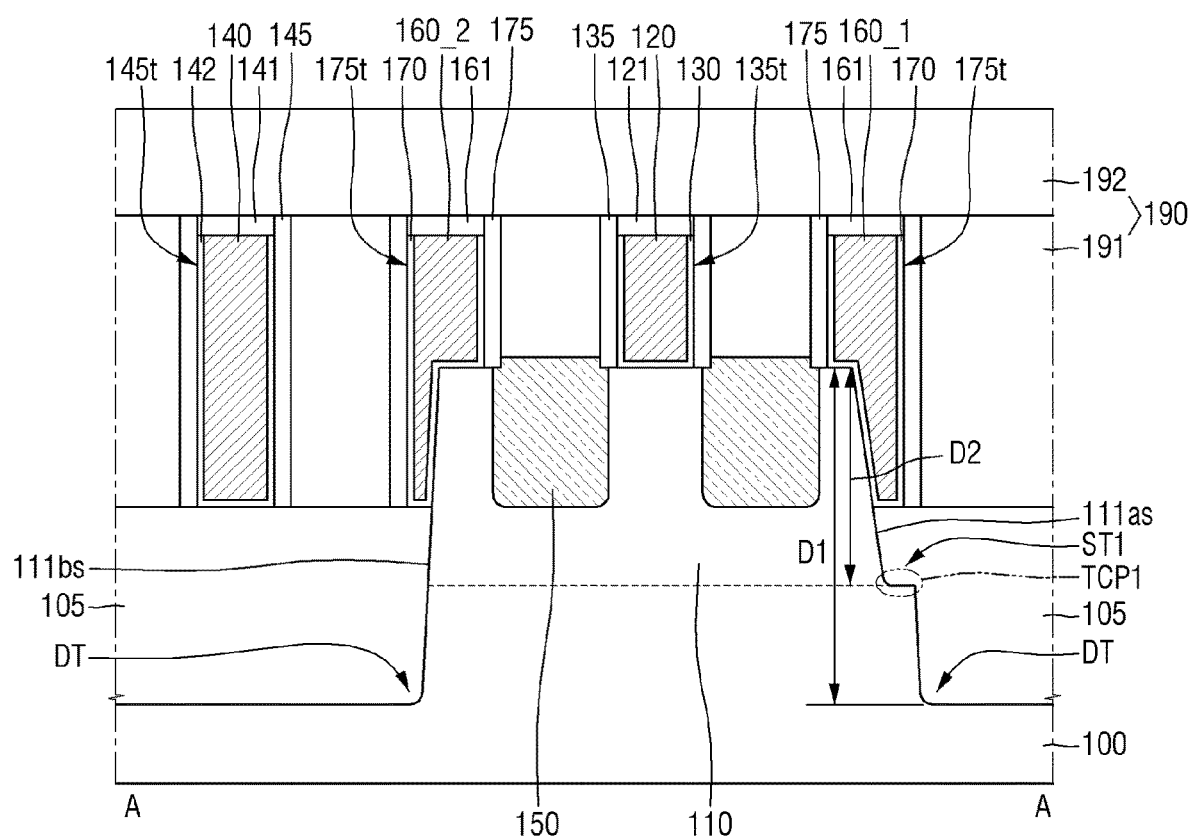
FIGS. 12 through 14 are cross-sectional views representing semiconductor devices according to some embodiments of the present disclosure.
Figure 13:
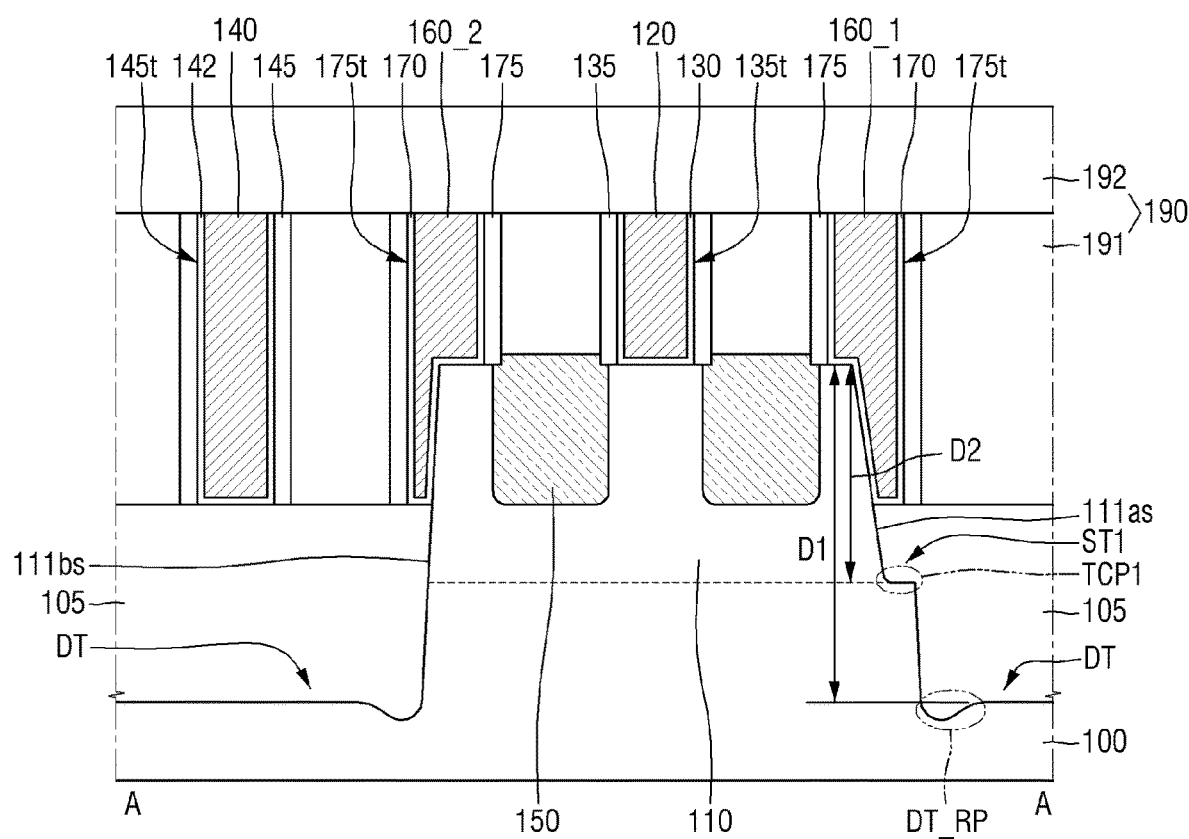
Figure 14:
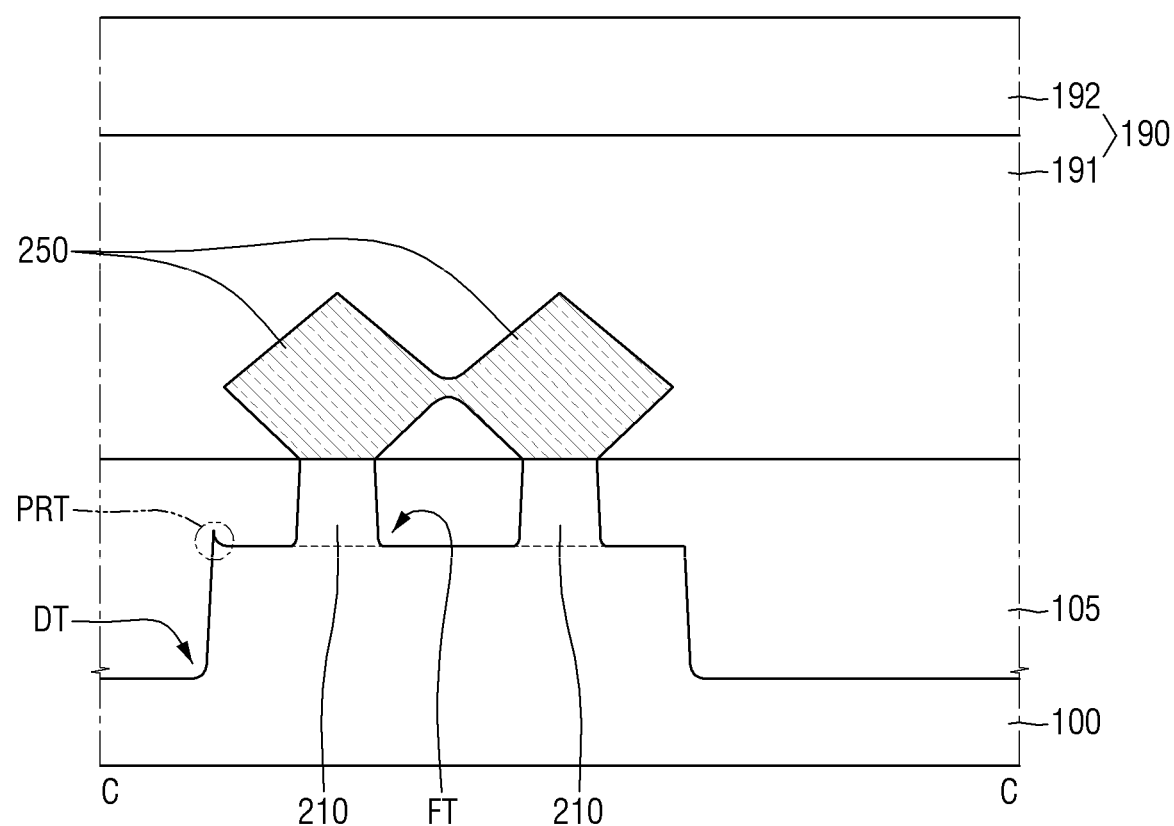

FIGS. 12 through 14 are cross-sectional views representing semiconductor devices according to some embodiments of the present disclosure. For convenience, the embodiments of FIGS. 12 through 14 will hereinafter be described, focusing mainly on differences relative to the embodiment of FIGS. 1 through 5.

Referring to FIG. 12, the semiconductor device may further comprise a normal gate capping pattern 121, a dummy gate capping pattern 141, and terminal gate capping patterns 161.

In some embodiments, a normal gate electrode 120 may partially fill a normal gate trench 135t and the normal gate capping pattern 121 may be formed on the normal gate electrode 120. The normal gate capping pattern 121 may fill the portion of the normal gate trench 135t that is not filled with the normal gate electrode 120. First and second terminal gate electrodes 160_1 and 160_2 may partially fill their own terminal gate trenches 175t. The terminal gate capping patterns 161 may be formed on the first and second terminal gate electrodes 160_1 and 160_2, respectively. The terminal gate capping patterns 161 may fill portions of the terminal gate trenches 175t that are not filled with the first and second terminal gate electrodes 160_1 and 160_2. The dummy gate capping pattern 141 may partially fill a dummy gate trench 145t.

FIG. 12 shows an embodiment where a normal gate insulating film 130 is not formed between the normal gate capping pattern 121 and a pair of normal spacers 135 and a terminal gate insulating film 170 is not formed between the terminal gate capping patterns 161 and respective pairs of terminal spacers 175, but the present disclosure is not limited thereto.

The top surface of the normal gate capping pattern 121, the top surfaces of the normal gate capping patterns 161, and the top surface of the dummy gate capping pattern 141 may be coplanar with the top surface of a lower interlayer insulating film 191. The normal gate capping pattern 121, the terminal gate capping patterns 161, and the dummy gate capping pattern 141 may comprise, a material having an etching selectivity to the lower interlayer insulating film 191. In various embodiments, the normal gate capping pattern 121, the terminal gate capping patterns 161, and the dummy gate capping pattern 141 may comprise, for example, at least one of silicon nitride (SiN), silicon oxynitride (SiON), silicon oxide (SiO$_2$), silicon carbonitride (SiCN), silicon oxycarbonitride (SiOCN), a combination thereof, and other suitable gate capping materials. This list is not exclusive and another material known to those of skill in the art can be utilized.

Referring to FIG. 13, a deep trench DT may include a recessed portion DT_RP, which is formed at a location where a sidewall and the bottom surface of the deep trench DT meet at a level below D1.

The depth of the recessed portion DT_RP can vary with respect to the top surface of a first tapered fin-type pattern 110.

Referring to FIG. 14, the semiconductor device may further include a protrusion structure PRT. The protrusion structure PRT may be formed adjacent to whichever of a pair of first normal fin-type patterns 210 is more distant, geometrically, from a first tapered fin-type pattern 110.

In other embodiments, he protrusion structure PRT may be formed between a long side of the first normal fin-type pattern 210 and a deep trench DT. The protrusion structure PRT may be located at the boundary between a fin trench FT formed at one side of the first normal fin-type pattern 210 and the deep trench DT. In some embodiments, the protrusion structure PRT may be formed at the boundary of an active region ACT (not shown in FIG. 14, but illustrated throughout the specification).

The protrusion structure PRT may be formed to protrude from the bottom of the fin trench FT. The protrusion structure PRT may be formed to be lower than the top surface of a field insulating film 105.

Figure 15:
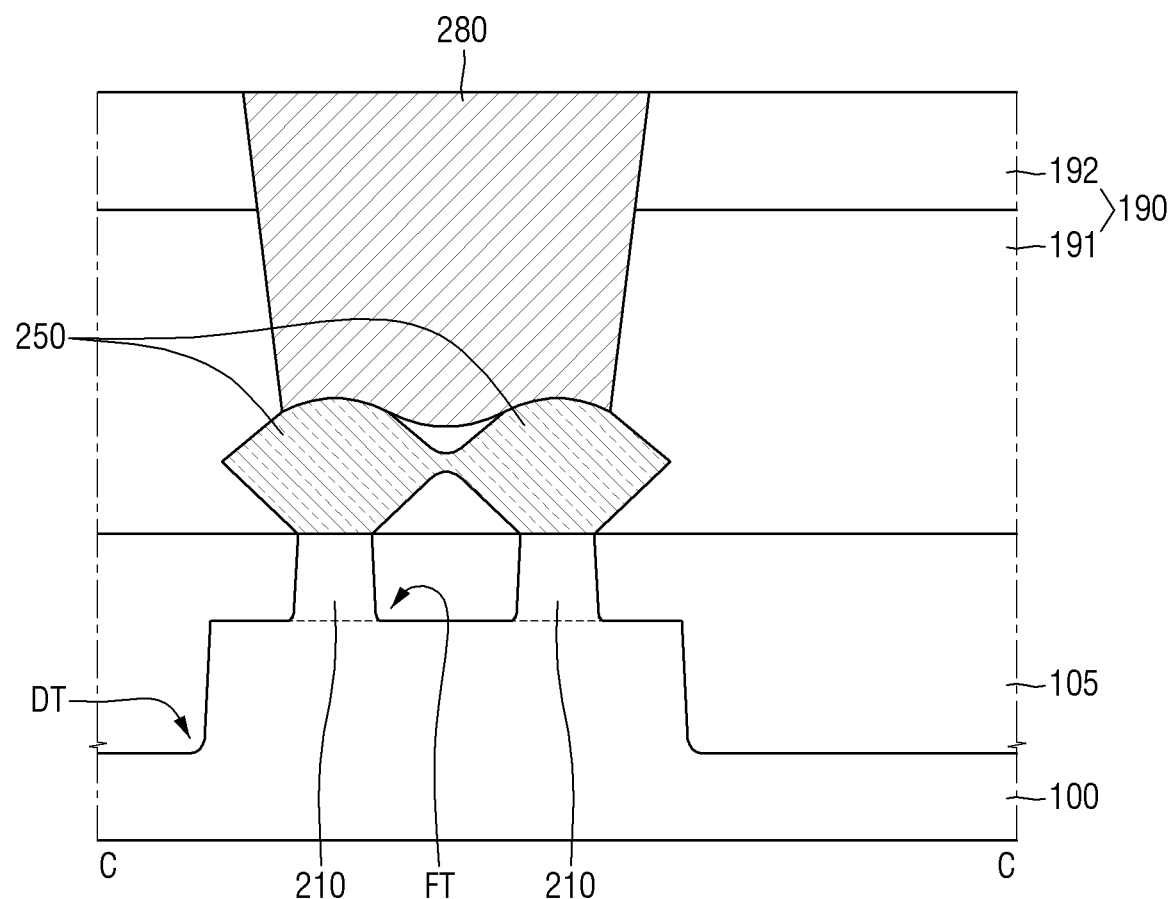
FIGS. 15 and 16 are cross-sectional views representing semiconductor devices according to some embodiments of the present disclosure.
Figure 16:
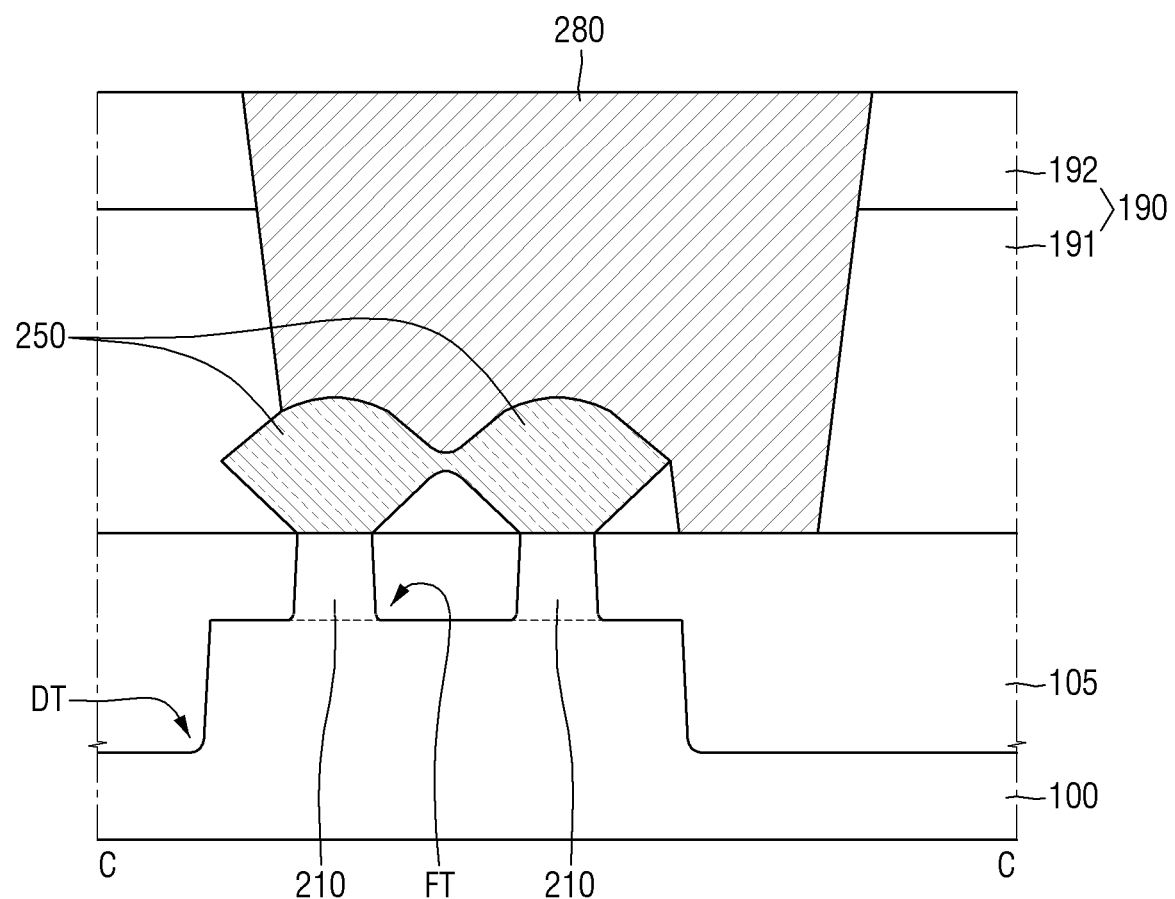

FIGS. 15 and 16 are cross-sectional views representing semiconductor devices according to some embodiments of the present disclosure. For convenience, the embodiments of FIGS. 15 and 16 will hereinafter be described, focusing mainly on differences relative to the embodiment of FIGS. 1 through 5.

Referring to FIGS. 15 and 16, the semiconductor devices according to the embodiments of FIGS. 15 and 16 may further include a contact 280 positioned above the epitaxial patterns 250. The contact 280 may be formed in an interlayer insulating film 190. The contact 280 may be electrically connected to a second epitaxial pattern 250. The second epitaxial pattern 250 is shown as being connected to the contact 280 with a portion thereof etched. Embodiments are not limited to the configurations depicted in this example illustration.

Referring to FIG. 15, the contact 280 may be formed on the second epitaxial pattern 250. In some embodiments, the contact 280 avoids direct contact with the field insulating film 105. In addition, in some embodiments, the contact 280 avoids overlapping with a first short side 111a of a first tapered fin-type pattern 110 in a first direction X.

Referring to FIG. 16, in other embodiments, a portion of the contact 280 may be placed in contact with the field insulating film 105. That is, the contact 280 may include a portion that overlaps with the first short side 111a (not shown in this Figure, but referenced above) of the first tapered fin-type pattern 110 in the first direction X.

Figure 17:
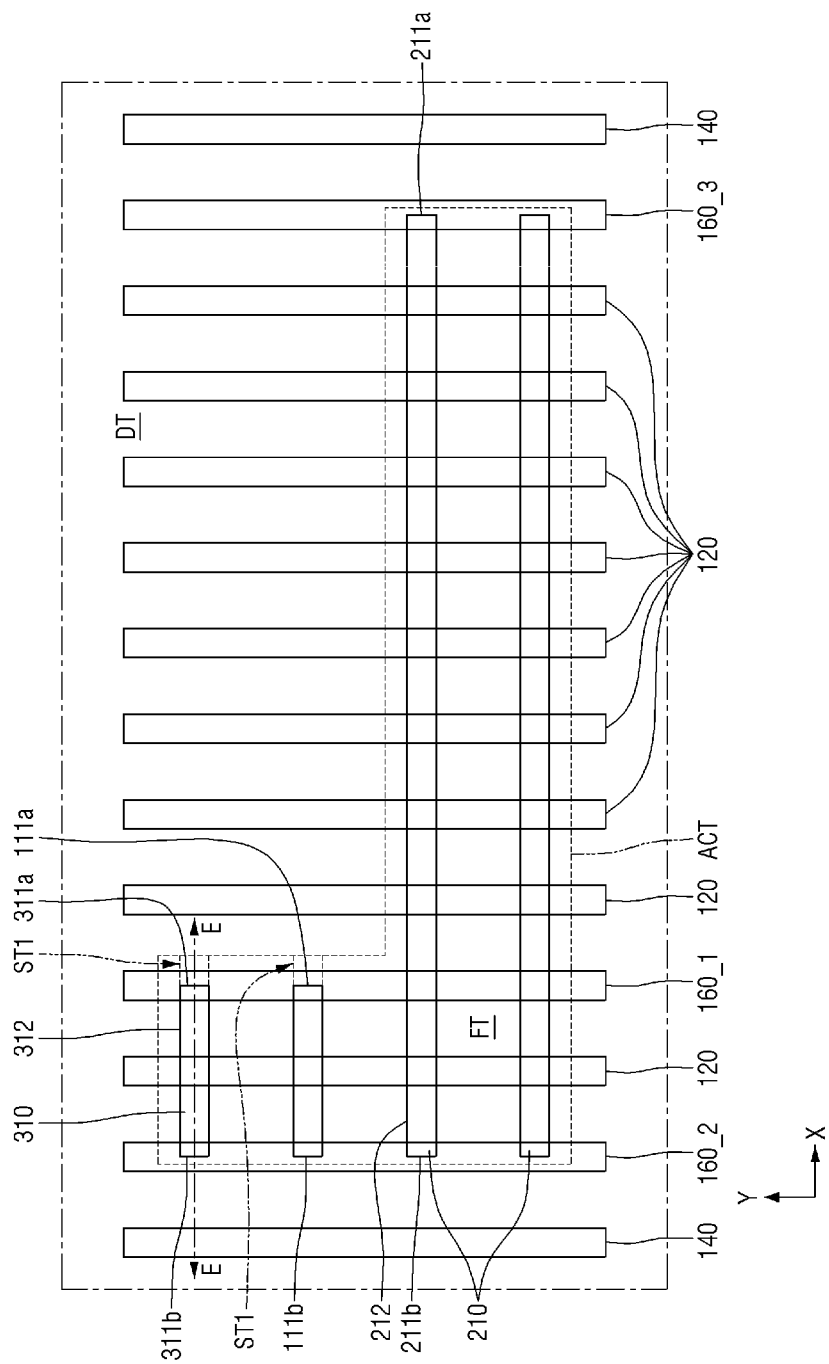
FIG. 17 is a layout view representing a semiconductor device according to some embodiments of the present disclosure.
Figure 18:
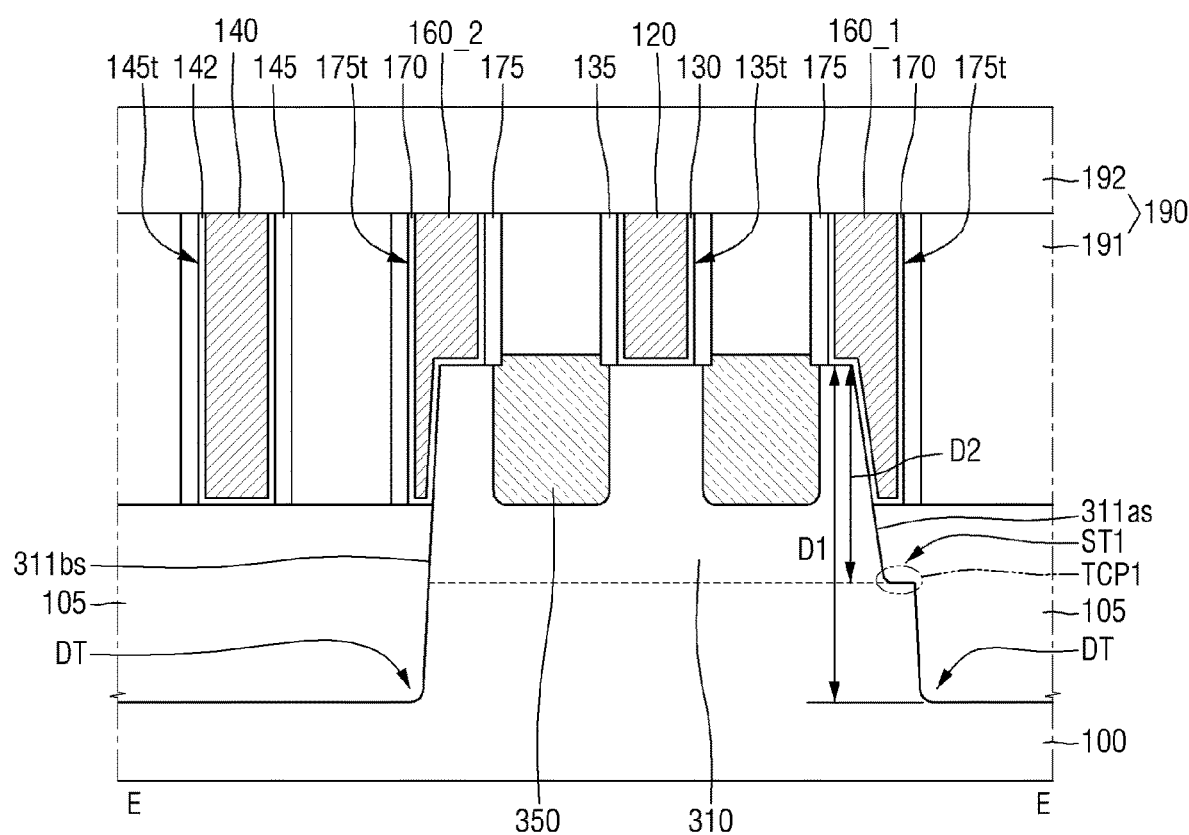
FIG. 18 is a cross-sectional view taken along line E-E of FIG. 17.

FIG. 17 is a layout view representing a semiconductor device according to some embodiments of the present disclosure. FIG. 18 is a cross-sectional view taken along line E-E of FIG. 17. For convenience, the embodiment of FIGS. 17 and 18 will hereinafter be described, focusing mainly on differences with the embodiment of FIGS. 1 through 5.

Referring to FIGS. 17 and 18, the semiconductor device may further include a second tapered fin-type pattern 310.

In some embodiments, the second tapered fin-type pattern 310 may be positioned in an active region ACT. The second tapered fin-type pattern 310 may have long sides 312, which extend in a first direction X, and first and second short sides 311a and 311b, which extend in a second direction Y. This forms a strip-like shape when viewed from the perspective of the layout view. In some embodiments, the long sides 312 of the second tapered fin-type pattern 310 may connect the first and second short sides 311a and 311b of the second tapered fin-type pattern 310. The first short side 311a of the second tapered fin-type pattern 310 may be positioned on the opposite location relative to the second short side 311b of the second tapered fin-type pattern 310.

In some embodiments, the second tapered fin-type pattern 310 may be disposed or positioned in parallel to a first tapered fin-type pattern 110 and a first normal fin-type pattern 210. The long sides 312 of the second tapered fin-type pattern 310 may be opposite to long sides 112 of the first tapered fin-type pattern 110 and long sides 212 of the first normal fin-type pattern 210. The first tapered fin-type pattern 110 may be disposed or positioned between the first normal fin-type pattern 210 and the second tapered fin-type pattern 310.

The first normal fin-type pattern 210 may include a protrusion portion that protrudes beyond the first short side 311a of the second tapered fin-type pattern 310 in a first direction (X). That is, when viewed from the second direction (Y), part of the first normal fin-type pattern 210 overlaps with the second tapered fin-type pattern 310, and the remainder of the first normal fin-type pattern 210 does not overlap with the second tapered fin-type pattern 310. The long sides 312 of the second tapered fin-type pattern 310 may be defined by a fin trench FT.

A first short sidewall 311as of the second tapered fin-type pattern 310 may define the first short side 311a of the second tapered fin-type pattern 310. In some embodiments, at least a portion of the first short sidewall 311as of the second tapered fin-type pattern 310 may be defined by a first shallow trench ST1 having a depth D2.

The first short sidewall 311as of the second tapered fin-type pattern 310 may include a sidewall of the first shallow trench ST1. The first short sidewall 311as of the second tapered fin-type pattern 310 may be connected to a sidewall of a deep trench DT. The first shallow trench ST1, which defines the first short sidewall 311as of the second tapered fin-type pattern 310, may directly adjoin the deep trench DT.

In some embodiments, a first connecting portion TCP1 may be formed in the region or the area between the sidewall of the deep trench DT and the sidewall of the first shallow trench ST1. This defines the first short sidewall 311as of the second tapered fin-type pattern 310. The first short sidewall 111as of the first tapered fin-type pattern 110 and the first short sidewall 311as of the second tapered fin-type pattern 310 may be formed simultaneously.

In some embodiments, a second short sidewall 311bs of the second tapered fin-type pattern 310 that defines the second short side 311b of the second tapered fin-type pattern 310 may be defined by the same deep trench DT. The second short sidewall 311bs of the second tapered fin-type pattern 310 may include the sidewall of the deep trench DT.

In some embodiments, first and second terminal gate electrodes 160_1 and 160_2 may be formed on the first tapered fin-type pattern 110, the second tapered fin-type pattern 310, and/or the first normal fin-type pattern 210. In other embodiments, the first and second terminal gate electrodes 160_1 and 160_2 may be positioned to intersect the first tapered fin-type pattern 110, the second tapered fin-type pattern 310, and the first normal fin-type pattern 210. In other embodiments, the first terminal gate electrode 160_1 may overlap with a first end portion of the second tapered fin-type pattern 310 that includes the first short side 311a of the second tapered fin-type pattern 310. Also, the second terminal gate electrode 160_2 may overlap with a second end portion of the second tapered fin-type pattern 310 that includes the second short side 311b of the second tapered fin-type pattern 310.

FIG. 18 represents that the first terminal gate electrode 160_1 surrounds the first end portion of the second tapered fin-type pattern 310 and the second terminal gate electrode 160_2 surrounds the second end portion of the second tapered fin-type pattern 310, but the present disclosure is not limited thereto as other options and variations are available to those of ordinary skill in the art. That is, it is sufficient that at least one of the first and second terminal gate electrodes 160_1 and 160_2 overlaps with the top surface of the second tapered fin-type pattern 310.

In some embodiments, when taken from the perspective of a layout view, the first terminal gate electrode 160_1 may overlap with a location where the sidewall of the first shallow trench ST1 that defines the first short sidewall 311as of the second tapered fin-type pattern 310 and the sidewall of the deep trench DT are connected. For example, in a layout view, the first terminal gate electrode 160_1 may at least partially overlap with the first connecting portion TCP1, which connects directly to the first short sidewall 311as of the second tapered fin-type pattern 310. In a layout view, the first terminal gate electrode 160_1 may overlap with the entire first connecting portion TCP1, which is connected to the first short sidewall 311as of the second tapered fin-type pattern 310, and at least part of the sidewall of the deep trench DT.

In some embodiments, the dummy gate electrodes 140 do not intersect the second tapered fin-type pattern 310. The second tapered fin-type pattern 310 may be disposed or positioned between the dummy gate electrodes 140.

Third epitaxial patterns 350 may be formed between normal gate electrodes 120 and the first and second terminal gate electrodes 160_1 and 160_2 or between the normal gate electrodes 120. The third epitaxial patterns 350 may be formed on the second tapered fin-type pattern 310.

Figure 19:
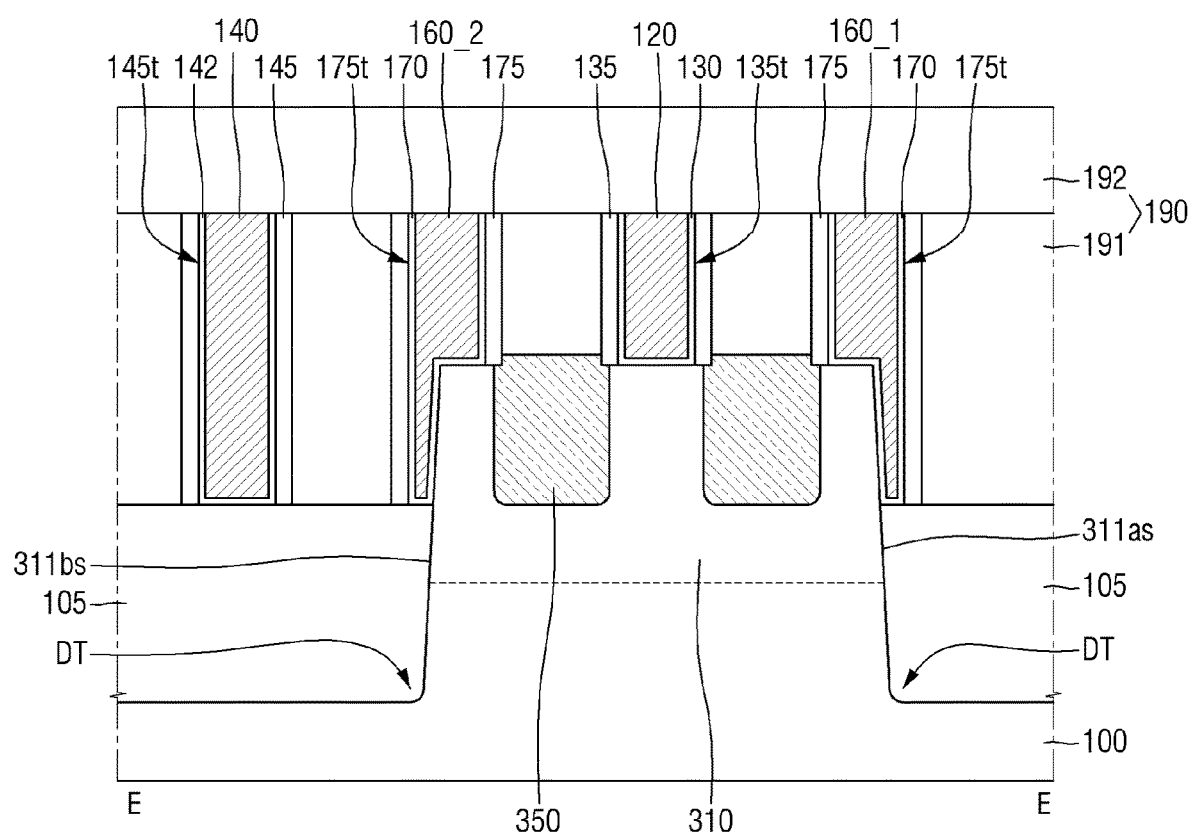
FIG. 19 is a cross-sectional view representing semiconductor devices according to some embodiments of the present disclosure.

FIG. 19 is a cross-sectional view representing semiconductor devices according to some embodiments of the present disclosure. For convenience, the embodiment of FIG. 19 will herein be described, focusing mainly on differences and distinctions with the embodiment of FIGS. 17 and 18.

Referring to FIG. 19, a first short sidewall 311as of a second tapered fin-type pattern 310 that defines a first short side 311a of the second tapered fin-type pattern 310 may be defined by a deep trench DT. The first short sidewall 311as of the second tapered fin-type pattern 310 may include a sidewall of the deep trench DT.

In some embodiments, a first short sidewall (111as of FIG. 2) of a first tapered fin-type pattern 110 may be formed by a method of forming a first shallow trench ST1 and a method of forming the deep trench DT. On the other hand, the first short sidewall 311as of the second tapered fin-type pattern 310 may be formed by the process of forming the deep trench DT without a requirement of the process of forming the first shallow trench ST1.

In some examples, such as the case where there are three or more tapered fin-type patterns are formed, as illustrated in FIG. 17, a short sidewall of a tapered fin-type pattern that overlaps with a first terminal gate electrode 160_1 may be defined by a sidewall of the first shallow trench ST1. The short sidewall of the tapered fin-type pattern that overlaps with the first terminal gate electrode 160_1 may be connected to the sidewall of the deep trench DT.

In yet another example, at least part of a short sidewall of a tapered fin-type pattern adjacent to a first normal fin-type pattern 210 may be defined by the sidewall of the first shallow trench ST1. On the other hand, a short sidewall of a tapered fin-type pattern distant from the first normal fin-type pattern 210 may be defined by the deep trench DT.

Figure 20:
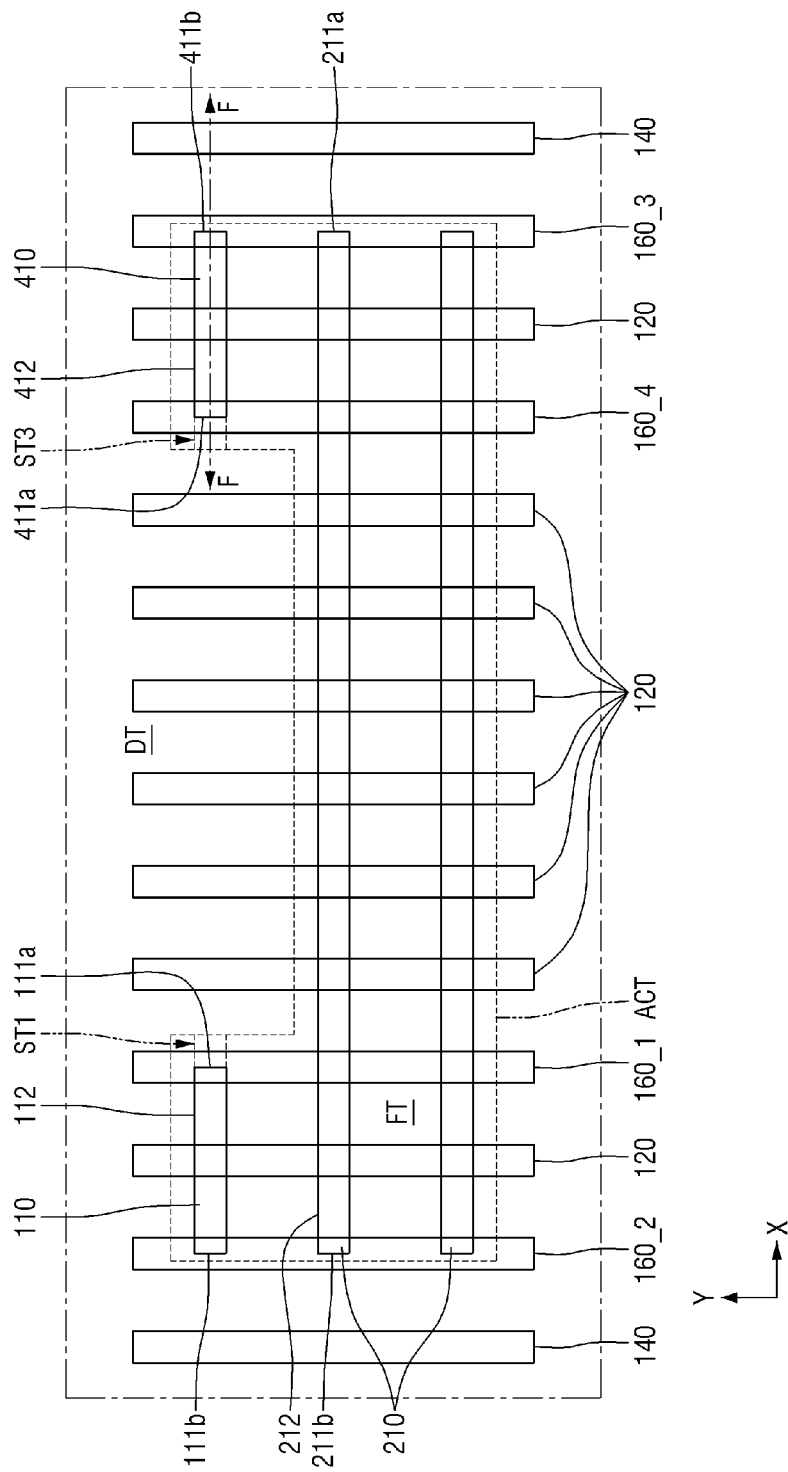
FIG. 20 is a layout view representing a semiconductor device according to some embodiments of the present disclosure.
Figure 21:
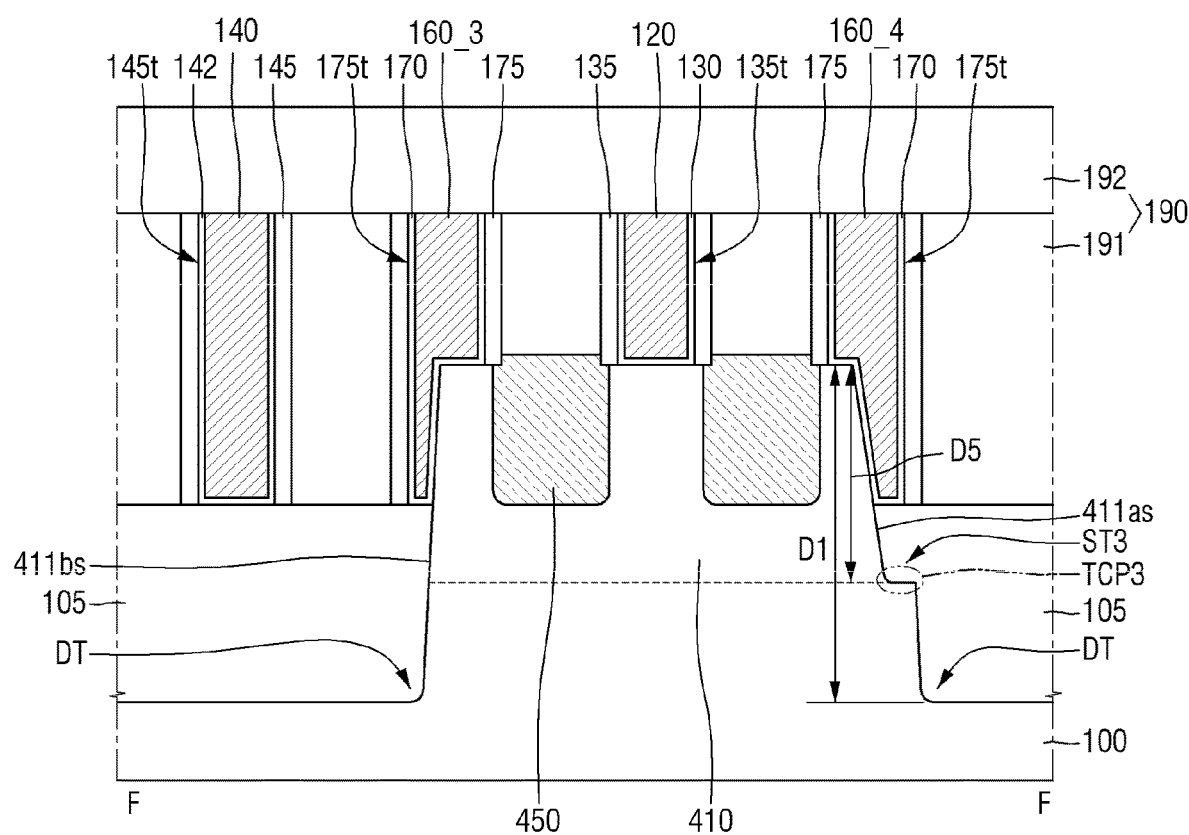
FIG. 21 is a cross-sectional view taken along line F-F of FIG. 20.

FIG. 20 is a layout view representing a semiconductor device according to some embodiments of the present disclosure. FIG. 21 is a cross-sectional view taken along line F-F of FIG. 20. For convenience, the embodiment of FIGS. 20 and 21 will herein be described, focusing mainly on differences with the embodiment of FIGS. 1 through 5.

Referring to FIGS. 20 and 21, the semiconductor device may further include a third tapered fin-type pattern 410 and a fourth terminal gate electrode 160_4.

The third tapered fin-type pattern 410 may be formed in an active region ACT. The third tapered fin-type pattern 410 may have long sides 412, which extend in a first direction X, and first and second short sides 411a and 411b, which extend in a second direction Y. The long sides 412 of the third tapered fin-type pattern 410 may connect the first and second short sides 411a and 411b of the third tapered fin-type pattern 410. From the perspective of a layout view the shape of the third tapered fin-type pattern 410 is generally rectangular.

The first short side 411a of the third tapered fin-type pattern 410 may be opposite to the second short side 411b of the third tapered fin-type pattern 410. The long sides 412 of the third tapered fin-type pattern 410 may be opposite to long sides 212 of the first normal fin-type pattern 210. The first short side 411a of the third tapered fin-type pattern 410 may be opposite to a first short side 111a of a first tapered fin-type pattern 110.

A first normal fin-type pattern 210 may include a portion that protrudes beyond the first short side 411a of the third tapered fin-type pattern 410 in the first direction X. That is, when viewed from the second direction Y, part of the first normal fin-type pattern 210 overlaps with the third tapered fin-type pattern 410, and the rest of the first normal fin-type pattern 210 does not overlap with the third tapered fin-type pattern 410.

Referring to FIG. 20, a first short side 211a of the first normal fin-type pattern 210 and the second short side 411b of the third tapered fin-type pattern 410 may be arranged along the second direction Y. The long sides 412 of the third tapered fin-type pattern 410 may be defined by a fin trench FT or the shape of the fin trench FT.

In some embodiments, no additional tapered fin-type pattern is formed between the first normal fin-type pattern 210 and the third tapered fin-type pattern 410.

A first short sidewall 411as of the third tapered fin-type pattern 410 may define a first short side 411a of the third tapered fin-type pattern 410. At least part of the first short sidewall 411as of the third tapered fin-type pattern 410 may be defined by a third shallow trench ST3 having an average depth D5. The first short sidewall 411as of the third tapered fin-type pattern 410 may include a sidewall of the third shallow trench ST3.

In some embodiments, the depth D5 of the third shallow trench ST3 may be less than a depth D1 of the deep trench DT. The depth D5 of the third shallow trench ST3 may be defined with respect and reference to the top surface of the third tapered fin-type pattern 410.

The third shallow trench ST3, which defines the first short sidewall 411as of the third tapered fin-type pattern 410, may directly adjoin the deep trench DT. A first shallow trench ST1 and the third shallow trench ST3 may be formed at the same time. The depth D5 of the third shallow trench ST3 may be substantially the same as a depth D2 of the first shallow trench ST1 forming a more evenly spaced pattern.

In some embodiments, a sidewall of the deep trench DT and the sidewall of the third shallow trench ST3 may be connected to each other. A third connecting portion TCP3 may be provided between the sidewall of the deep trench DT and the third shallow trench ST3. In other words, the sidewall of the deep trench DT and the sidewall of the third shallow trench ST3 may be connected via the third connecting portion TCP3. In another embodiment, the third connecting portion TCP3 may connect the first short sidewall 411as of the third tapered fin-type pattern 410 and the sidewall of the deep trench DT.

Alternatively, the sidewall of the third shallow trench ST3 that defines the first short sidewall 411as of the third tapered fin-type pattern 410 may be directly connected to the sidewall of the deep trench DT.

In some embodiments, the third connecting portion TCP3 may be formed at a location where the sidewall of the deep trench DT and the sidewall of the third shallow trench ST3 are connected. Additionally, the third connecting portion TCP3 may include the bottom surface of the third shallow trench ST3. A second short sidewall 411bs of the third tapered fin-type pattern 410 that defines the second short side 411b of the third tapered fin-type pattern 410 may be defined by the deep trench DT. The second short sidewall 411bs of the third tapered fin-type pattern 410 may include the sidewall of the deep trench DT.

In some embodiments, a field insulating film 105 may partially fill the deep trench DT and the third shallow trench ST3. The field insulating film 105 may surround part of the third tapered fin-type pattern 410. The top surface of the field insulating film 105 may be located at a higher vertical position than the vertical location where the sidewall of the deep trench DT and the sidewall of the third shallow trench ST3 are connected, with respect to the top surface of the third tapered fin-type pattern 410. For example, the third connecting portion TCP3 may be covered by the field insulating film 105.

Third and fourth terminal gate electrodes 160_3 and 160_4 may be formed on the third tapered fin-type pattern 410 and the first normal fin-type pattern 210 to intersect the third tapered fin-type pattern 410 and the first normal fin-type pattern 210. The third terminal gate electrode 160_3 may overlap with a first end portion of the third tapered fin-type pattern 410 that includes the second short side 411b of the third tapered fin-type pattern 410. The fourth terminal gate electrode 160_4 may overlap with a second end portion of the third tapered fin-type pattern 410 that includes the first short side 411a of the third tapered fin-type pattern 410.

In a layout view, the fourth terminal gate electrode 160_4 may overlap with the location where the sidewall of the third shallow trench ST3 and the sidewall of the deep trench DT are connected. For example, in a layout view, the fourth terminal gate electrode 160_4 may at least partially overlap with the third connecting portion TCP3. In a layout view, the fourth terminal gate electrode 160_4 may overlap with the entire third connecting portion TCP3 and at least part of the sidewall of the deep trench DT.

In some embodiments, dummy gate electrodes 140 do not intersect the third tapered fin-type pattern 410.

Fourth epitaxial patterns 450 may be formed between normal gate electrodes 120 and the third and fourth terminal gate electrodes 160_3 and 160_4 or in between the normal gate electrodes 120. The fourth epitaxial patterns 450 may be formed on the third tapered fin-type pattern 410.

Figure 22:
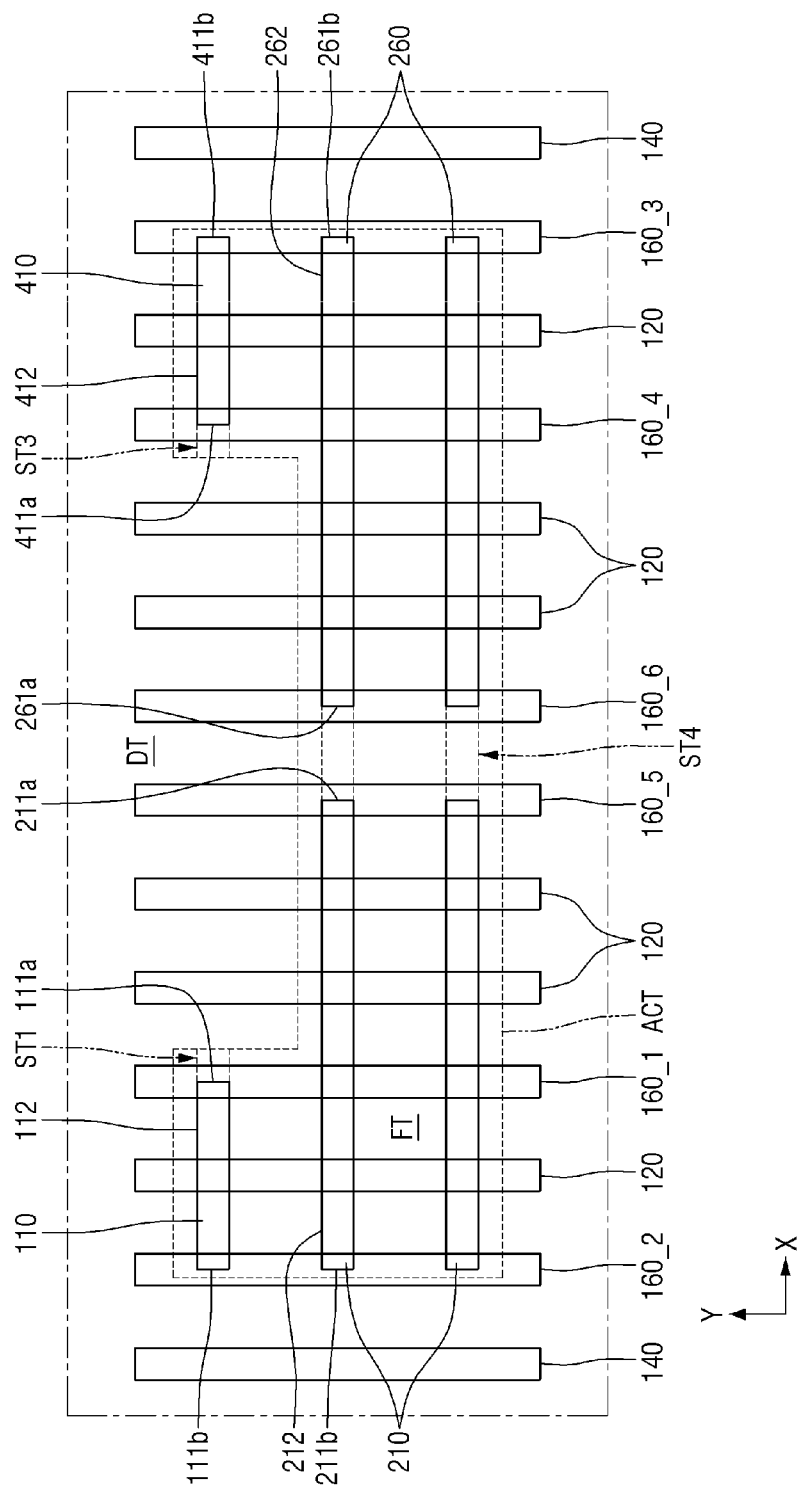
FIG. 22 is a layout view representing a semiconductor device according to some embodiments of the present disclosure.

FIG. 22 is a layout view representing a semiconductor device according to some embodiments of the present disclosure. For convenience, the embodiment of FIG. 22 will hereinafter be described, focusing mainly on differences with the embodiment of FIGS. 20 and 21.

Referring to FIG. 22, the semiconductor device may further include a second normal fin-type pattern 260 and fifth and sixth terminal gate electrodes 160_5 and 160_6.

At least one second normal fin-type pattern 260 may be formed in an active region ACT. The second normal fin-type pattern 260 may have long sides 262, which extend in a first direction X, and first and second short sides 261a and 261b, which extend in a second direction Y. This forms a strip shape or a rectangular shape in a layout view.

A third tapered fin-type pattern 410 may be positioned in parallel to or substantially in parallel to the second normal fin-type pattern 260. The long sides 262 of the second normal fin-type pattern 260 may be opposite to long sides 412 of the third tapered fin-type pattern 410.

Other features of this embodiment may include, the first short side 261a of the second normal fin-type pattern 260 may be opposite to a first short side 211a of a first normal fin-type pattern 210. A fourth shallow trench ST4 may be formed between the first and second normal fin-type patterns 210 and 260. For this embodiment, the first and second normal fin-type patterns 210 and 260 may be separated by the fourth shallow trench ST4.

First and third shallow trenches ST1 and ST3 and the fourth shallow trench ST4 may be formed at the same time. A sidewall of the first normal fin-type pattern 210 that represents or defines the first short side 211a of the first normal fin-type pattern 210 may be defined by the fourth shallow trench ST4 having the same depth as the third shallow trench ST3. A sidewall of the second normal fin-type pattern 260 that defines the first short side 261a of the second normal fin-type pattern 260 may also be defined by the fourth shallow trench ST4 having the same depth as the third shallow trench ST3.

In some embodiments, a third terminal gate electrode 160_3 may overlap with a first end portion of the third tapered fin-type pattern 410 that comprises a second short side 411b of the third tapered fin-type pattern 410 and a first end portion of the second normal fin-type pattern 260 that includes a second short side 261b of the second normal fin-type pattern 260. A fourth terminal gate electrode 160_4 may overlap with the second normal fin-type pattern 260.

Furthermore, in some embodiments, the fifth terminal gate electrode 160_5 may overlap with a first end portion of the first normal fin-type pattern 210 that includes the first short side 211a of the first normal fin-type pattern 210. The sixth terminal gate electrode 160_6 may overlap with a second end portion of the second normal fin-type pattern 260 that includes the first short side 261a of the second normal fin-type pattern 260.

According to embodiments of the present disclosure, at least two normal gate electrodes 120 may be formed between the fourth and sixth terminal gate electrodes 160_4 and 160_6 and between the first and fifth terminal gate electrodes 160_1 and 160_5.

In order to form the first, third, and fourth shallow trenches ST1, ST3, and ST4, while, at the same time by using a single mask, at least two normal gate electrodes 120 may need to be formed between the fourth and sixth terminal gate electrodes 160_4 and 160_6 and between the first and fifth terminal gate electrodes 160_1 and 160_5.

FIG. 22 represents that the first and second normal fin-type patterns 210 and 260, a first tapered fin-type pattern 110, and the third tapered fin-type pattern 410 are disposed or positioned in the same active region ACT; however, embodiments of the present disclosure are not limited thereto. That is, alternatively, the first normal fin-type pattern 210 and the first tapered fin-type pattern 110 may be formed in a different active region ACT from the second normal fin-type pattern 260 and the third tapered fin-type pattern 410, in which case, a deep trench may be formed between the first short side 211a of the first normal fin-type pattern 210 and the first short side 261a of the second normal fin-type pattern 260.

Figure 23:
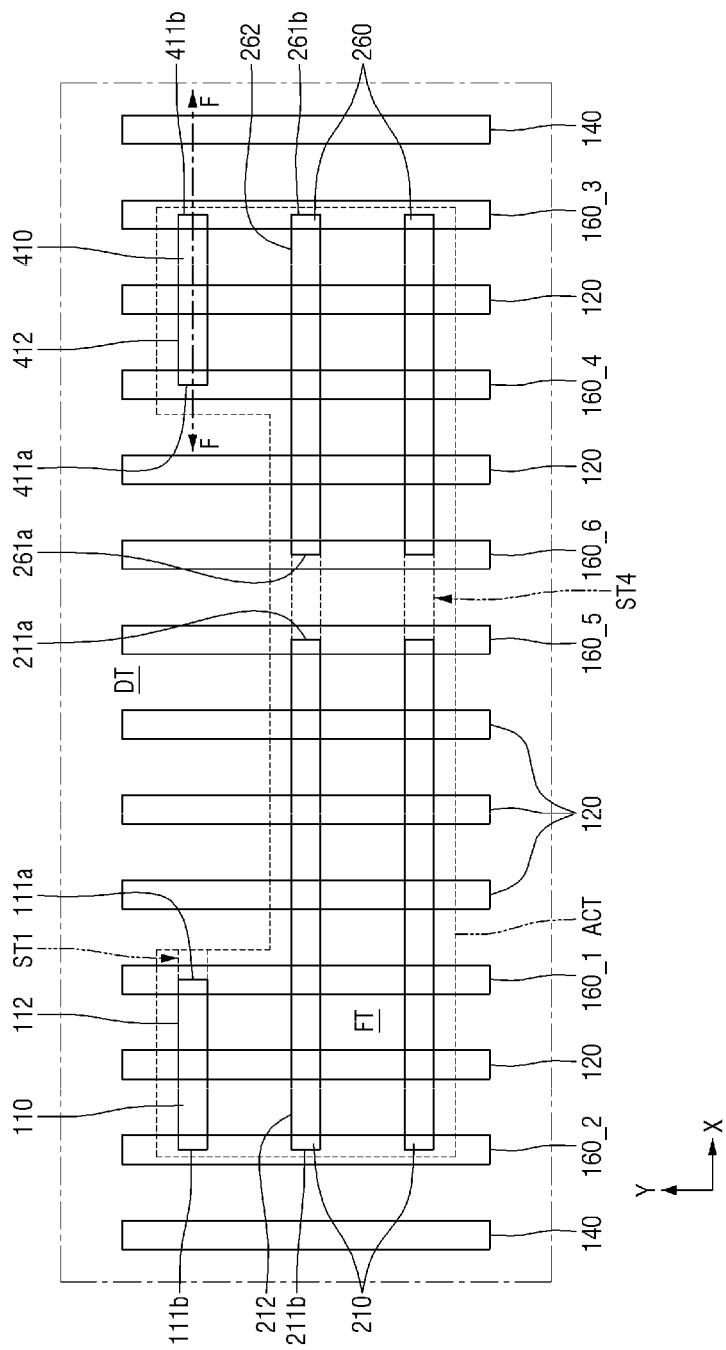
FIG. 23 is a layout view representing a semiconductor device according to some embodiments of the present disclosure.
Figure 24:
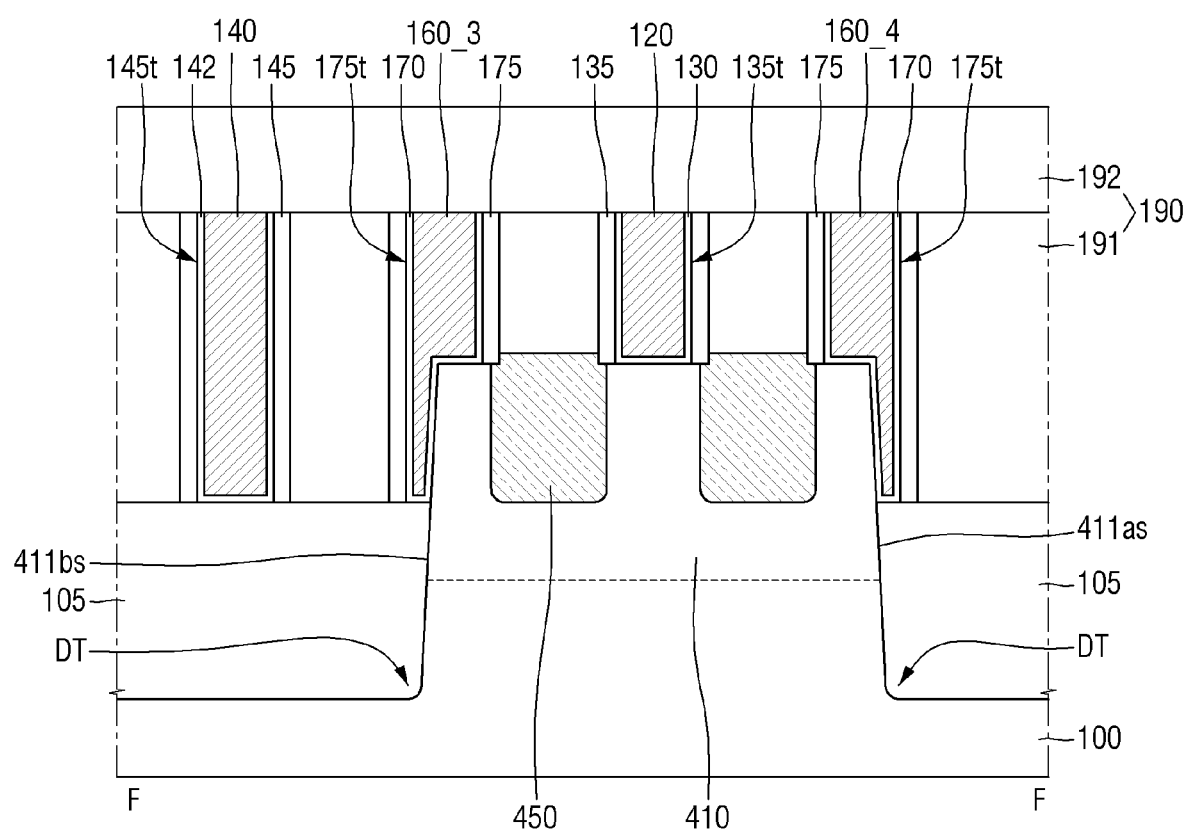
FIG. 24 is a cross-sectional view taken along line F-F of FIG. 23.

FIG. 23 is a layout view representing a semiconductor device according to some embodiments of the present disclosure. FIG. 24 is a cross-sectional view taken along line F-F of FIG. 23. For convenience, the embodiment of FIGS. 23 and 24 will hereinafter be described, focusing mainly on differences with the embodiments of FIGS. 20 through 22.

Referring to FIGS. 23 and 24, a normal gate electrode 120 may be formed between fourth and sixth terminal gate electrodes 160_4 and 160_6.

In a layout where the normal gate electrode 120 may be formed between fourth and sixth terminal gate electrodes 160_4 and 160_6, it can be difficult to form third and fourth shallow trenches ST3 and ST4 at the same time by using a single mask. That is, one of the third and fourth shallow trenches ST3 and ST4 cannot be formed, or is unable to be formed.

In the embodiment of FIGS. 23 and 24, the third shallow trench ST3 is not formed. A first short sidewall 411as of a third tapered fin-type pattern 410 may be formed by a process or method of forming a deep trench DT without a requirement of a process of forming a shallow trench.

Figure 25:
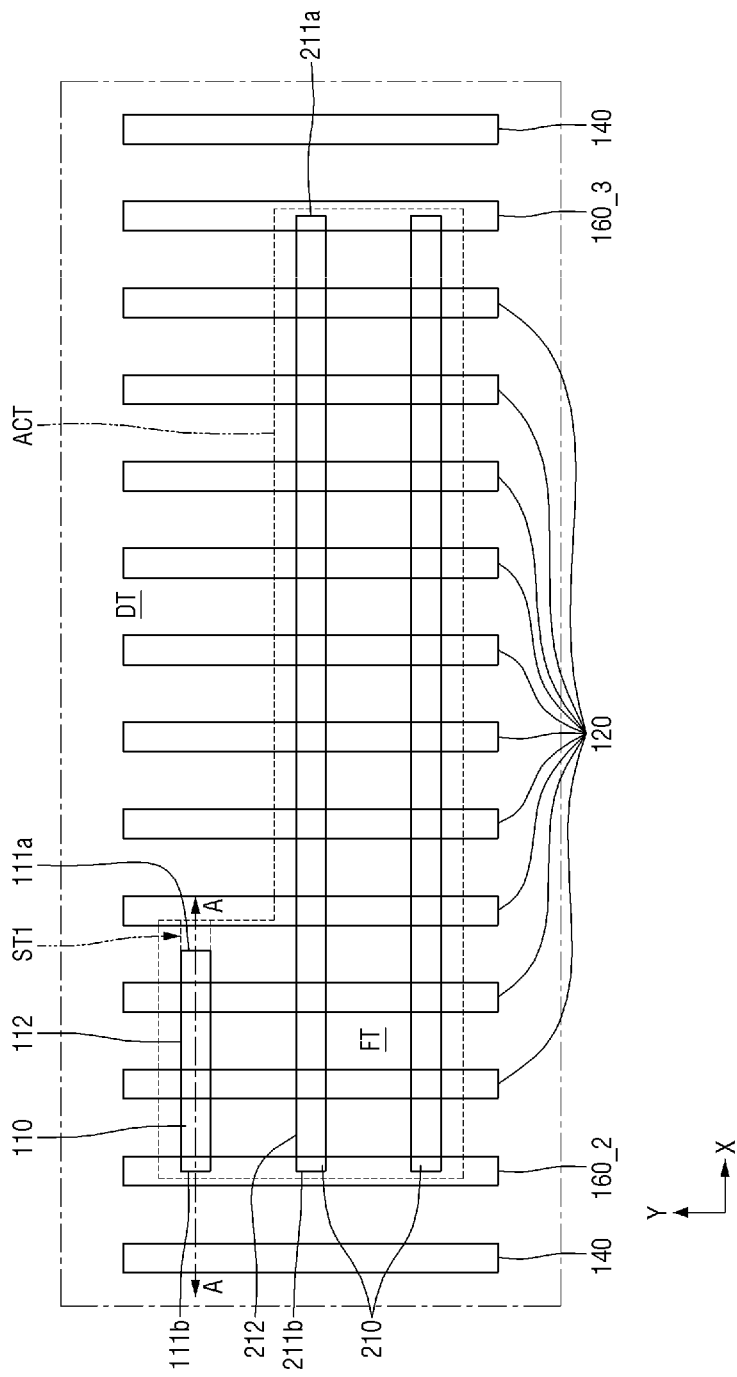
FIG. 25 is a layout view representing a semiconductor device according to some embodiments of the present disclosure.
Figure 26:
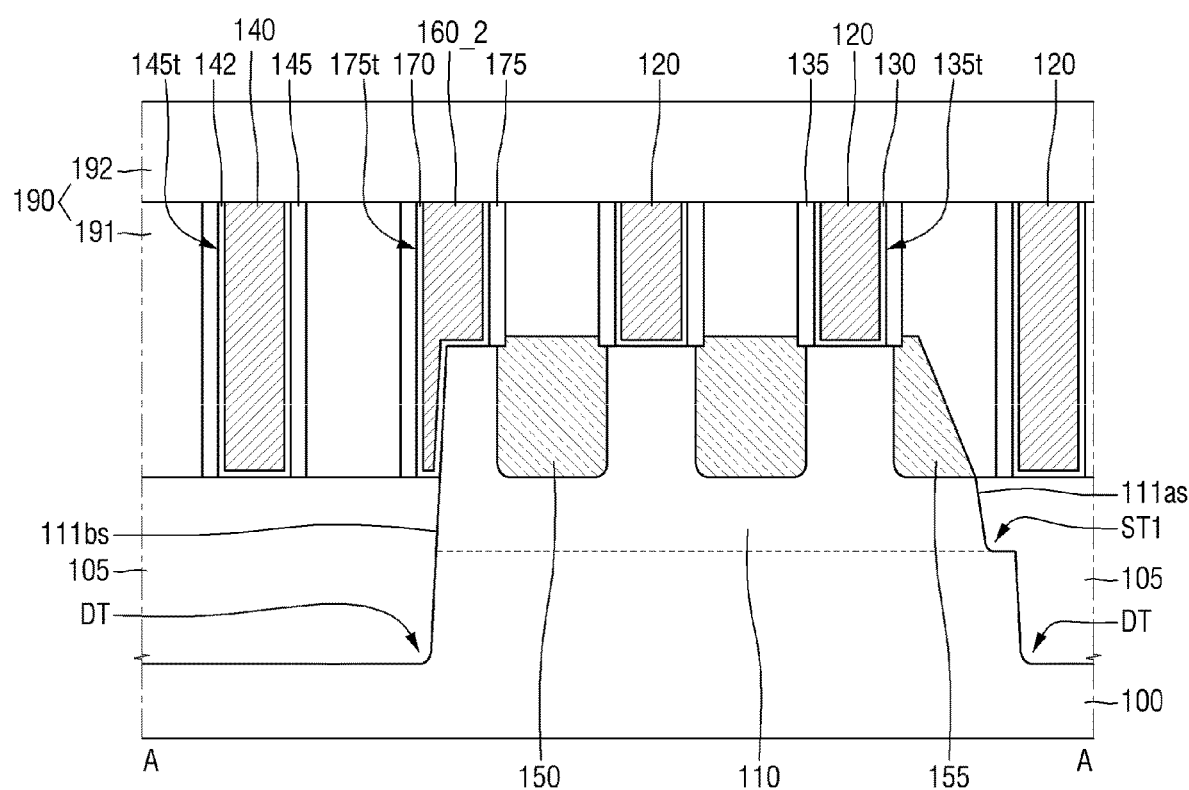
FIG. 26 is a cross-sectional view taken along line A-A of FIG. 25.

FIG. 25 is a layout view representing a semiconductor device according to some embodiments of the present disclosure. FIG. 26 is a cross-sectional view taken along line A-A of FIG. 25. For convenience, the embodiment of FIGS. 25 and 26 will herein be described, focusing mainly on differences with the embodiment of FIGS. 1 through 5.

Referring to FIGS. 25 and 26, the semiconductor device may further include a terminal epitaxial pattern 155.

A first short side 111a of a first tapered fin-type pattern 110 may not overlap with second and third terminal gate electrodes 160_2 and 160_3. In a layout view, the first short side 111a of the first tapered fin-type pattern 110 may be positioned between a pair of adjacent normal gate electrodes 120.

The terminal epitaxial pattern 155 may be formed on the first tapered fin-type pattern 110. The terminal epitaxial pattern 155 may be formed at a first end portion of the first tapered fin-type pattern 110 that includes the first short side 111a of the first tapered fin-type pattern 110.

Figure 27:
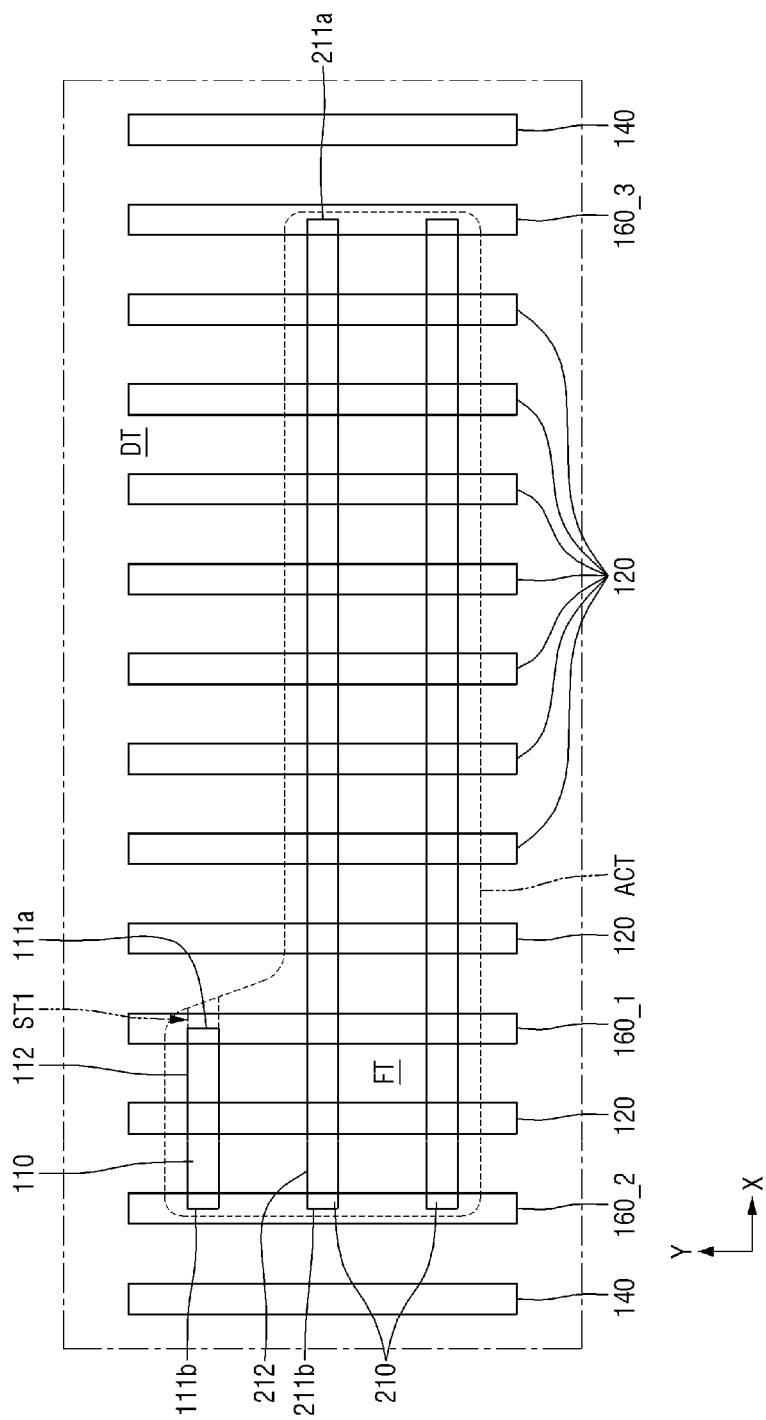
FIG. 27 is a layout view representing a semiconductor device according to some embodiments of the present disclosure.

FIG. 27 is a layout view representing a semiconductor device according to some embodiments of the present disclosure. For convenience, the embodiment of FIG. 27 will herein be described, focusing mainly on differences with the embodiment of FIGS. 1 through 5.

Referring to FIG. 27, a first connecting portion TCP1, which is defined by a first shallow trench ST1, may include a portion whose width in a second direction Y decreases.

The width of the first connecting portion TCP1 in the second direction Y decreases further away relative to a first side 111a of a first tapered fin-type pattern 110.

Figure 30:
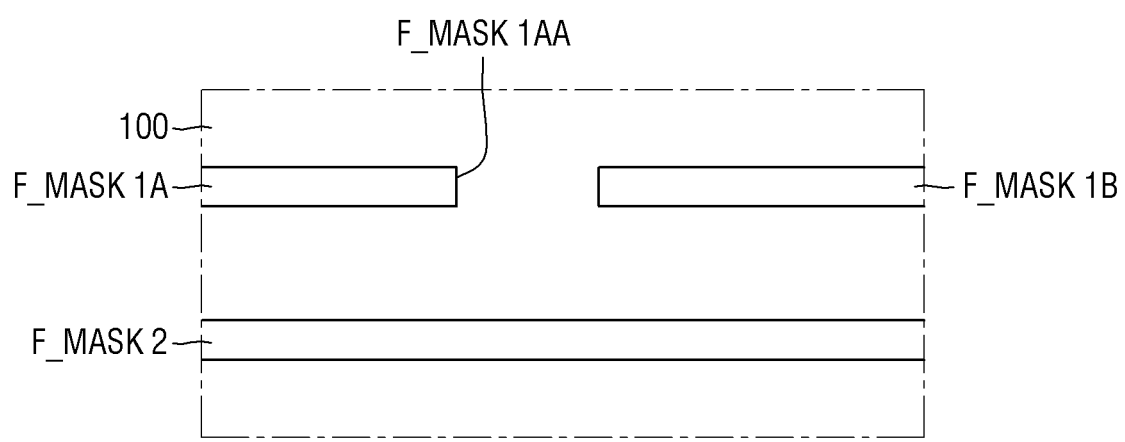
Figure 31:
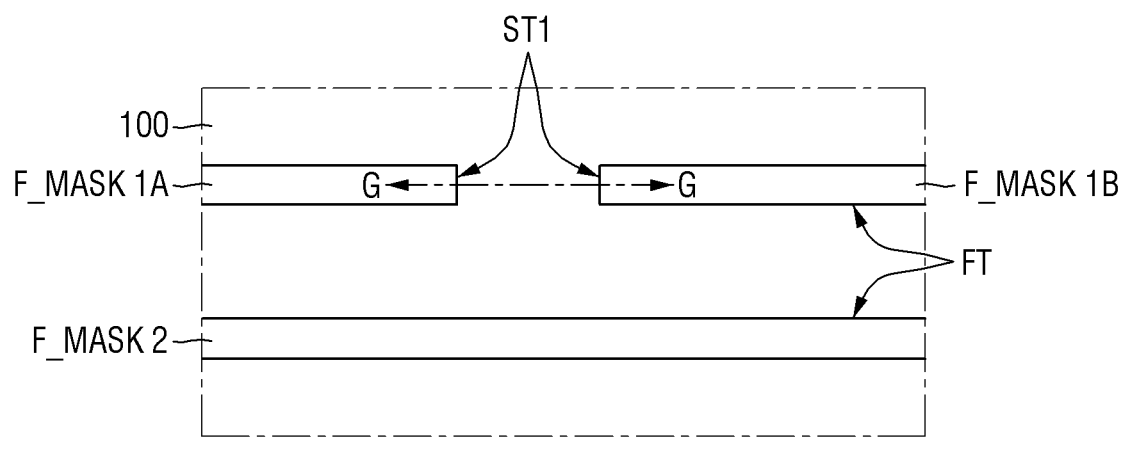
Figure 32:
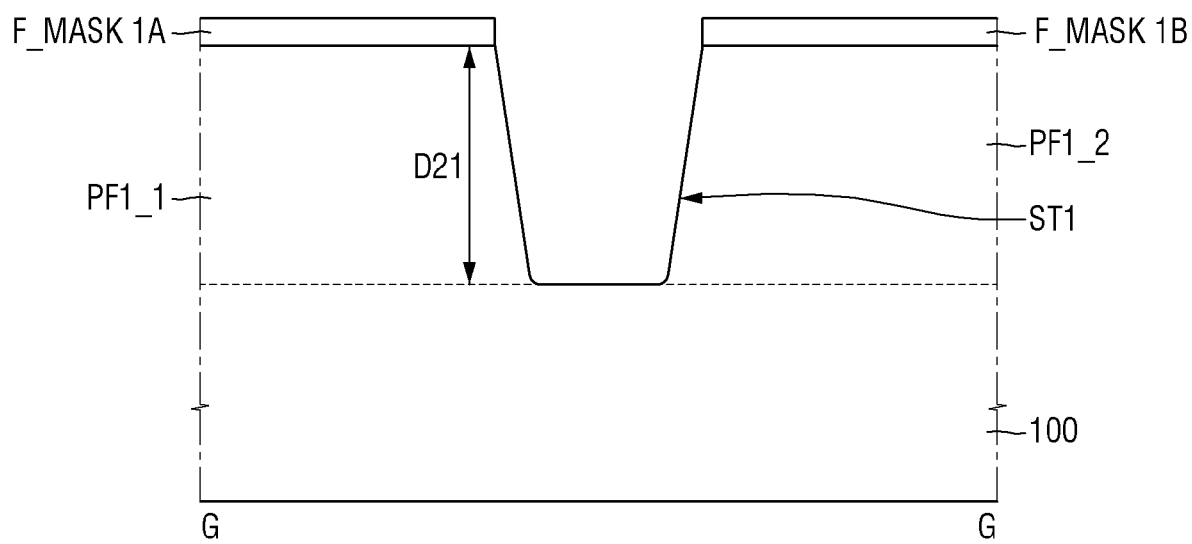
Figure 33:
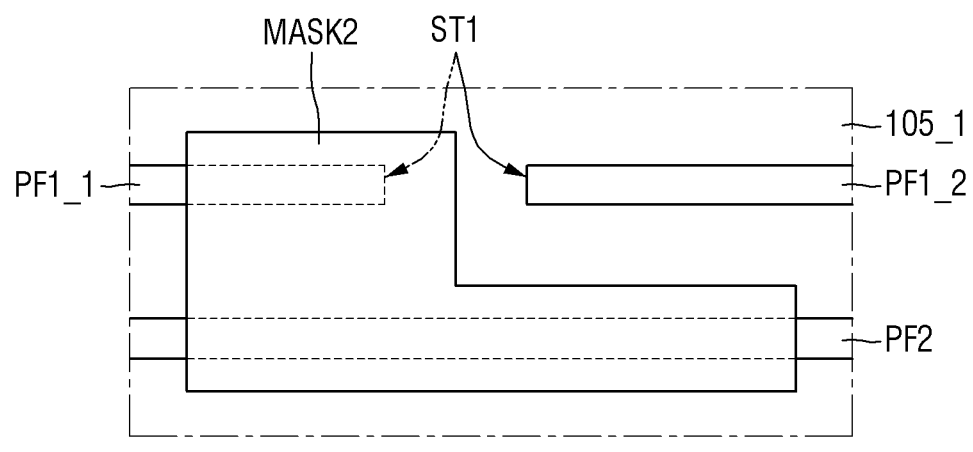
Figure 33:
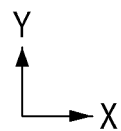
Figure 34:
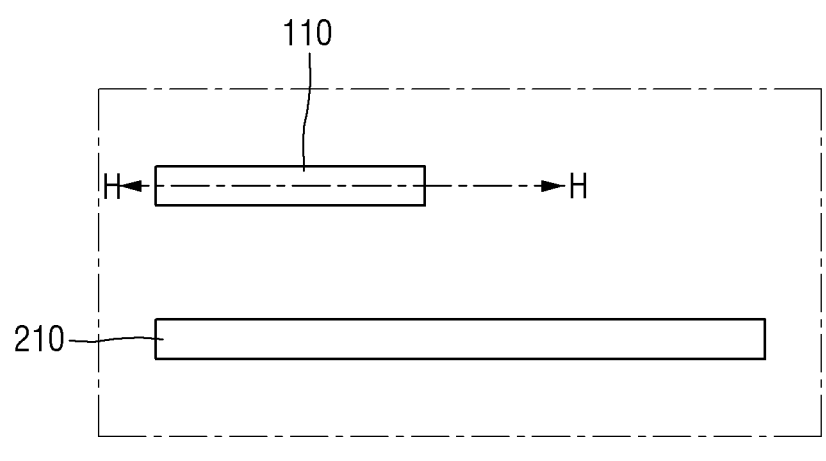
Figure 35:
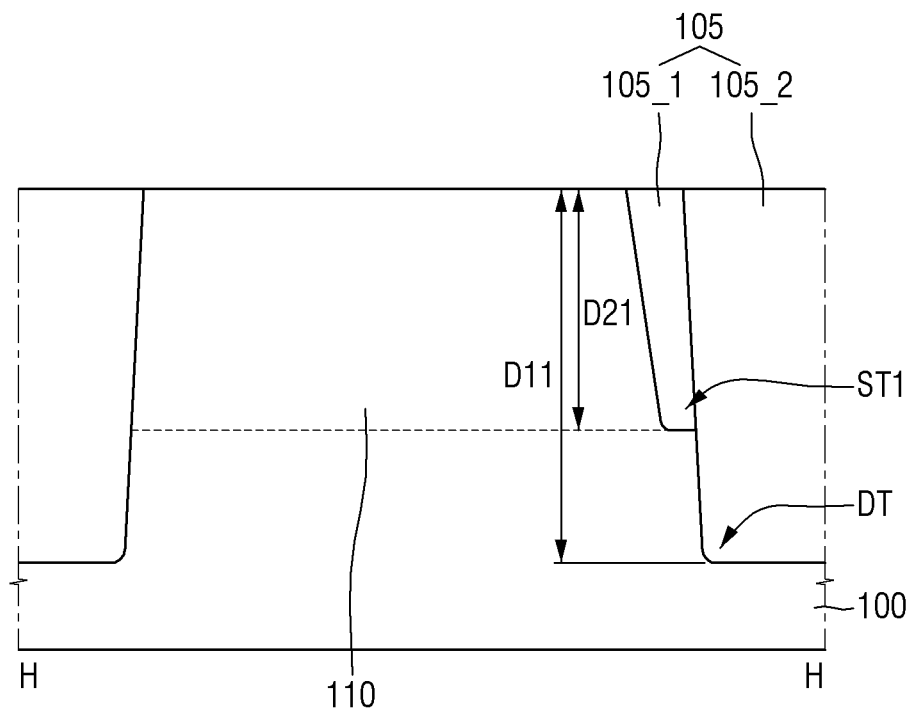

FIGS. 28 through 35 are views representing a method of fabricating a semiconductor device according to some embodiments of the present disclosure. FIG. 32 is a cross-sectional view taken along line G-G of FIG. 31. FIG. 35 is a cross-sectional view taken along line H-H of FIG. 33.

Figure 28:
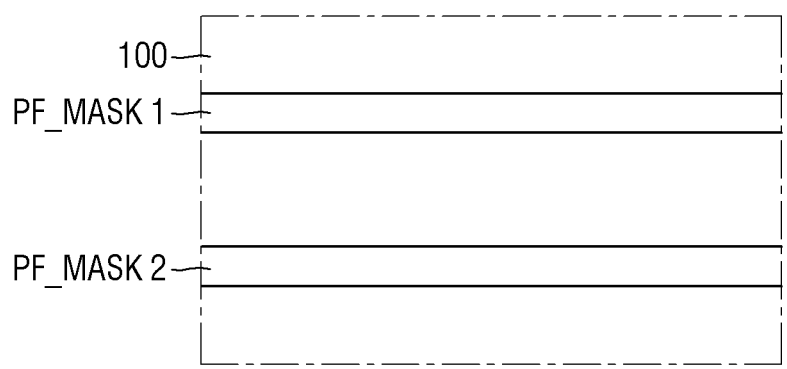
FIGS. 28 through 35 are views representing a method of fabricating a semiconductor device according to some embodiments of the present disclosure.

Referring to FIG. 28, a first and a second pre-fin mask patterns PF_MASK1, PF_MASK2 are formed on a substrate 100.

The first and second pre-fin mask patterns PF_MASK1, PF_MASK2 may extend in a first direction X. The first and second pre-fin mask patterns PF_MASK1 and PF_MASK2 may be arranged or organized along a second direction Y. The long sides of the first pre-fin mask pattern PF_MASK1 may be opposite to the long sides of the second pre-fin mask pattern PF_MASK2.

Figure 29A:
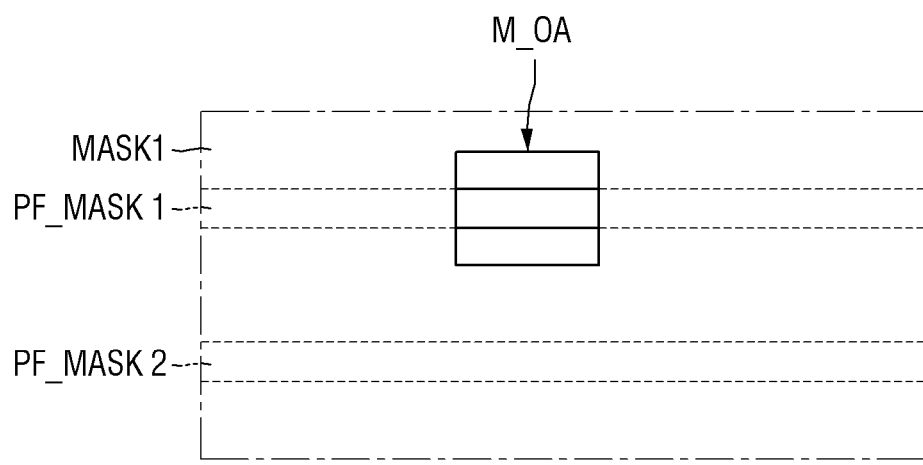
Figure 29B:
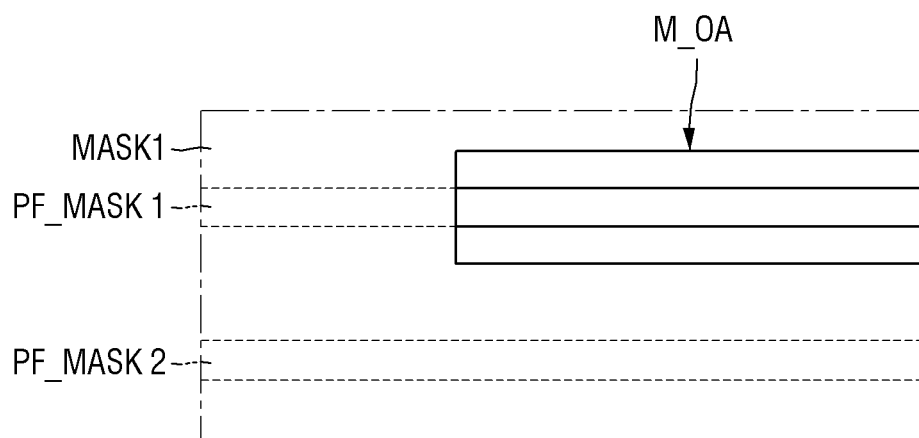
Figure 29C:
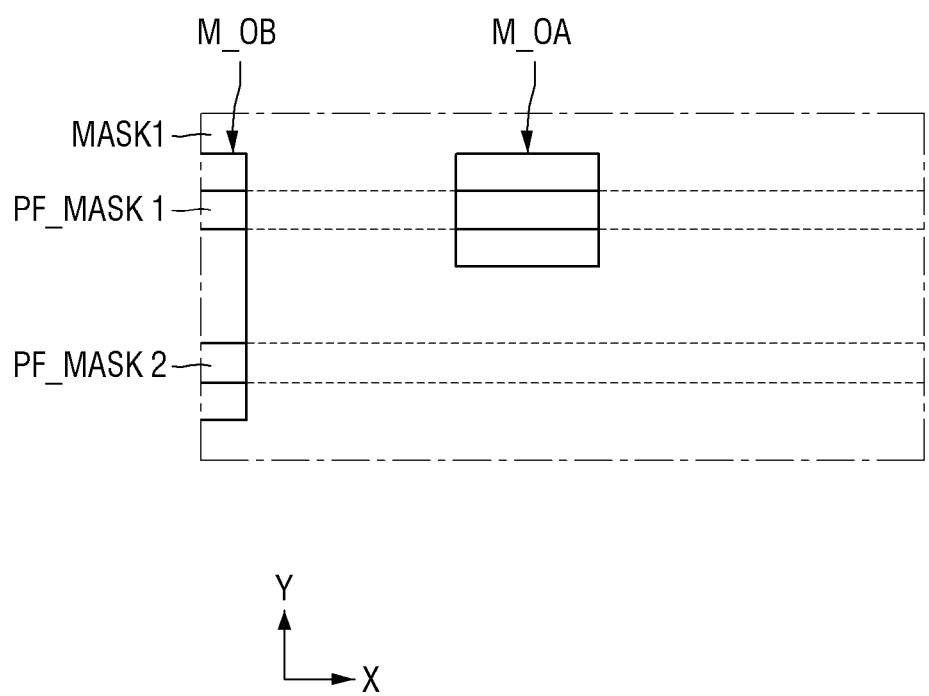

Referring to FIGS. 29A through 29C, a first mask MASK1 including a first opening M_OA may be formed on the substrate 100.

The first opening M_OA may expose part of the first pre-fin mask pattern PF_MASK1, however it may not expose the second pre-fin mask pattern PF_MASK2.

FIGS. 29A and 29B illustrate first openings M_OA that the first mask MASK1 may include in order to expose the first pre-fin mask pattern PF_MASK1.

Referring to FIG. 29C, the first mask MASK1 may include not only the first opening M_OA, but also a second opening M_OB, which exposes part of the first pre-fin mask pattern PF_MASK1 and part of the second pre-fin mask pattern PF_MASK2.

In the description herein, it is assumed that the first mask MASK1 of FIG. 29A is used.

Referring to FIG. 30, a portion of the first pre-fin mask pattern PF_MASK1 may be removed using the first mask MASK1.

In some embodiments, as the first pre-fin mask pattern PF_MASK1 is partially removed, first and second tapered fin mask patterns F_MASK1A and F_MASK1B may be formed on the substrate 100. By performing an etching process using the first mask MASK1, the first and second tapered fin mask patterns F_MASK1A and F_MASK1B may be formed to be spaced apart from each other.

The second pre-fin mask pattern PF_MASK2 may thereby become a second fin mask pattern F_MASK2.

The first tapered fin mask pattern F_MASK1A may have a short side F_MASK1AA, which extends in a second direction Y. The second tapered fin mask pattern F_MASK1B may have a short side that is opposite to the short side F_MASK1AA of the first tapered fin mask pattern F_MASK1A.

The second pre-fin mask pattern PF_MASK2, which corresponds with a location where the first and second tapered fin mask patterns F_MASK1A and F_MASK1B are separated is not removed using the first mask MASK1. Thus, the second fin mask pattern F_MASK2 may include a portion that protrudes beyond the short side F_MASK1AA of the first tapered fin-mask pattern F_MASK1A in the first direction X.

Referring to FIGS. 31 and 32, a first pre-fin-type pattern (PF1_1 and PF1_2) may be formed using the first and second tapered fin mask patterns F_MASK1A and F_MASK1B. A second pre-fin-type pattern PF2 may be formed using the second fin mask pattern F_MASK2.

In some embodiments, the first pre-fin-type pattern (PF1_1 and PF1_2) may include first and second portions PF1_1 and PF1_2, separated by a first shallow trench ST having a depth D21. The depth D21 of the first shallow trench ST1 may be the same as the depth D2 of FIG. 2, but the present disclosure is not limited thereto. The depth D21 of the first shallow trench ST1 may become equal to the depth D2 of FIG. 2 as a result of the process of modifying the shape of pre-fin-type patterns (i.e., the first pre-fin-type pattern (PF1_1 and PF1_2) and the second pre-fin-type pattern PF2) use them as a channel region.

Short sides of the first and second portions PF1_1 and PF1_2 of the first pre-fin-type pattern (PF1_1 and PF1_2) may be defined by the first shallow trench ST1.

A fin trench FT may be formed between a long side of the first portion PF1_1 of the first pre-fin-type pattern (PF1_1 and PF1_2) and a long side of the second pre-fin-type pattern PF2 and between a long side of the second portion PF1_2 of the first pre-fin-type pattern (PF1_1 and PF1_2) and the long side of the second pre-fin-type pattern PF2.

Referring to FIG. 33, a second mask MASK2, which partially overlaps with the first shallow trench ST1, the first portion PF1_1 of the first pre-fin-type pattern (PF1_1 and PF1_2), and the second pre-fin-type pattern PF2, may be formed. The second mask MASK2 may be a mask used to define the active region ACT of FIG. 1.

Before the formation of the second mask MASK2, a first field insulating film portion 105_1, which fills the first shallow trench ST1 and the fin trench FT, may be formed on the substrate 100. The first and second tapered fin mask patterns F_MASK1A and F_MASK1B and the second fin mask pattern F_MASK2 may be removed.

Referring to FIGS. 34 and 35, a deep trench DT having a depth D11, which is greater than the depth D21 of the first shallow trench ST1, may be formed using the second mask MASK2. The depth D11 of the deep trench DT may be greater than the depth D21 of the first shallow trench ST1.

The depth D11 of the deep trench DT may be the same as the first depth D1 of FIG. 2, but the present disclosure is not limited thereto.

During the formation of the deep trench DT with the use of the second mask MASK2, the second pre-fin-type pattern PF2, the second portion PF1_2 of the first pre-fin-type pattern (PF1_1 and PF1_2), and the first portion PF1_1 of the first pre-fin-type pattern (PF1_1 and PF1_2) may be at least partially etched.

As a result, a first tapered fin-type pattern 110 and a first normal fin-type pattern 210 may be formed.

Also, the first field insulating film portion 105_1, which fills the first shallow trench ST1 and the fin trench FT, may be partially etched and removed.

Then, a second field insulating film portion 105_2 that fills the deep trench DT may be formed. A field insulating film 105 may include the second field insulating film portion 105_2, which fills the deep trench DT and the first field insulating film portion 105_1, which fills the first shallow trench ST1 and the fin trench FT.

The embodiments of the present disclosure have been described with reference to the attached drawings, but it may be understood by those of ordinary skill in the art that the present disclosure may be performed by those of ordinary skill in the art in other specific forms without changing the technical concept or essential features of the present disclosure. Further, the above-described embodiments are merely examples or various embodiments and do not limit the scope of the rights of the present disclosure.

What is claimed is:
1. A semiconductor device comprising:
a substrate;
a field insulating film disposed on the substrate;
a plurality of fins disposed on the substrate, and including a first fin, a second fin and a third fin;
a plurality of gate electrodes including a first gate electrode and a second gate electrode;

a first epitaxial pattern disposed between the first gate electrode and the second gate electrode, and disposed on the first fin;

a second epitaxial pattern disposed between the first gate electrode and the second gate electrode, and disposed on the second fin; and a contact pattern disposed on the first epitaxial pattern and the second epitaxial pattern, wherein the first epitaxial pattern contacts the second epitaxial pattern to form a merged epitaxial pattern, a bottom surface of the contact pattern is uneven, and a space is formed between the contact pattern and the merged epitaxial pattern such that the contact pattern contacts a first portion of the merged epitaxial pattern and is spaced apart from a second portion of the merged epitaxial pattern.

2. The semiconductor device of claim 1, wherein the contact pattern contacts an upper surface of the field insulating film.

3. The semiconductor device of claim 1, further comprising a third epitaxial pattern disposed on the third fin, a sidewall of the third epitaxial pattern being inclined.

4. The semiconductor device of claim 1, wherein at least a portion of a first sidewall of the first fin is defined by a first trench that has a first depth, a second trench adjoins the first trench and has a second depth that is greater than the first depth, and a second sidewall of the first fin is defined by a third trench having a third depth.

5. The semiconductor device of claim 4, wherein the third depth is less than the second depth.

6. The semiconductor device of claim 4, wherein the third depth is the same as the second depth.

7. The semiconductor device of claim 4, wherein at least one of the second trench and the third trench includes a recess on a bottom surface.

8. A semiconductor device comprising:
a substrate;
a plurality of fins disposed on the substrate, and including a first fin and a second fin;
a plurality of gate electrodes including a first gate electrode and a second gate electrode; and
a first epitaxial pattern disposed between the first gate electrode and the second gate electrode,
wherein the first gate electrode is disposed on the first fin and the second fin,
an upper portion of a first sidewall of the first fin is defined by a first trench that has a first depth,
a second trench adjoins the first trench and has a second depth that is greater than the first depth,
a lower portion of the first sidewall of the first fin is defined by the second trench,
a second sidewall of the first fin is defined by a third trench having a third depth that is less than the second depth,
the first sidewall of the first fin has a step shape, and
the second sidewall of the first fin is substantially straight.

9. The semiconductor device of claim 8, wherein the first depth is the same as the third depth.

10. The semiconductor device of claim 8, wherein a slope of the upper portion of the first sidewall of the first fin is different from a slope of the lower portion of the first sidewall of the first fin.

11. The semiconductor device of claim 8, wherein at least one of the second trench and the third trench includes a recess on a bottom surface.

12. The semiconductor device of claim 8, wherein a protrusion is disposed between the first trench and the second trench.

13. The semiconductor device of claim 8, further comprising a contact pattern disposed on the first epitaxial pattern, wherein at least a portion of the contact pattern is disposed below an upper surface of the first epitaxial pattern, and
a bottom surface of the contact pattern is uneven.

14. The semiconductor device of claim 8, wherein a horizontal length of the first fin is different from a horizontal length of the second fin.

15. A semiconductor device comprising:
a substrate;
a plurality of fins disposed on the substrate, and including a first fin and a second fin; and
a plurality of gate electrodes including a first gate electrode and a second gate electrode,
wherein the first gate electrode is disposed on the first fin and the second fin,
the second gate electrode is disposed on the first fin and the second fin,
at least a portion of a first sidewall of the first fin is defined by a first trench that has a first depth,
a second trench adjoins the first trench and has a second depth that is greater than the first depth,
a second sidewall of the first fin is defined by a third trench having a third depth that is equal to or greater than the first depth,
at least one of the second trench and the third trench includes a recess on a bottom surface, and
a protrusion is disposed between the first trench and the second trench.

16. The semiconductor device of claim 15, wherein the third depth is the same as the second depth.

17. The semiconductor device of claim 15, further comprising:
a first epitaxial pattern disposed between the first gate electrode and the second gate electrode, and disposed on the first fin;
a second epitaxial pattern disposed between the first gate electrode and the second gate electrode, and disposed on the second fin; and
a contact pattern disposed on the first epitaxial pattern and the second epitaxial pattern.

18. The semiconductor device of claim 15, wherein a slope of an upper portion of the first sidewall of the first fin is different from a slope of a lower portion of the first sidewall of the first fin.

19. The semiconductor device of claim 15, wherein a number of gate electrodes that the first fin contacts is different from a number of gate electrodes that the second fin contacts.

20. The semiconductor device of claim 15, wherein a horizontal length of the first fin is different from a horizontal length of the second fin.

* * * * *